United States Patent
Zhou et al.

(10) Patent No.: US 12,212,302 B2
(45) Date of Patent: Jan. 28, 2025

(54) SURFACE ACOUSTIC WAVE RESONATOR DEVICE AND METHOD FOR MANUFACTURING THE SAME AND FILTER

(71) Applicant: Shenzhen Newsonic Technologies Co., Ltd., Guangdong (CN)

(72) Inventors: Chencheng Zhou, Guangdong (CN); Gongbin Tang, Shenzhen (CN); Jie Zou, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/398,906

(22) Filed: Dec. 28, 2023

(65) Prior Publication Data
US 2024/0171148 A1 May 23, 2024

(30) Foreign Application Priority Data
Oct. 18, 2023 (CN) .......................... 202311345399.2

(51) Int. Cl.
*H03H 9/02* (2006.01)
*H03H 3/10* (2006.01)
*H03H 9/145* (2006.01)
*H03H 9/25* (2006.01)

(52) U.S. Cl.
CPC .......... *H03H 9/02834* (2013.01); *H03H 3/10* (2013.01); *H03H 9/145* (2013.01); *H03H 9/25* (2013.01)

(58) Field of Classification Search
CPC .. H03H 9/02818; H03H 9/02086; H03H 9/25; H03H 9/145; H03H 9/10; H03H 9/02834

USPC ........................................................ 310/313 R
See application file for complete search history.

(56) References Cited

U.S. PATENT DOCUMENTS

| | | | |
|---|---|---|---|
| 8,183,737 B2* | 5/2012 | Kimura | H03H 9/0222 310/313 R |
| 10,938,371 B2* | 3/2021 | Nakamura | H03H 9/02858 |
| 2013/0049533 A1* | 2/2013 | Matsuda | H03H 9/02834 310/313 C |
| 2020/0212876 A1* | 7/2020 | Goto | H03H 9/173 |
| 2021/0126616 A1* | 4/2021 | Hiramatsu | H03H 9/1457 |
| 2022/0271734 A1* | 8/2022 | Abbott | H03H 9/6483 |

(Continued)

*Primary Examiner* — J. San Martin
(74) *Attorney, Agent, or Firm* — Leason Ellis LLP

(57) ABSTRACT

A surface acoustic wave resonator device and method for manufacturing the same and filter, the surface acoustic wave resonator device includes: a piezoelectric substrate; an interdigital transducer, disposed on the piezoelectric substrate and comprising a first interdigital electrode structure and a second interdigital electrode structure, wherein each interdigital electrode structure comprises an interdigital electrode and an interdigital electrode lead-out part connected with each other; and a first temperature compensation layer, disposed on the piezoelectric substrate and comprising a body part and a protruding part, wherein the body part covers the interdigital transducer, the protruding part is protruded from the body part towards the piezoelectric substrate in a third direction perpendicular to a main surface of the piezoelectric substrate, and is surrounded by the piezoelectric substrate in a direction parallel to the main surface of the piezoelectric substrate.

19 Claims, 8 Drawing Sheets

(56) References Cited

U.S. PATENT DOCUMENTS

| | | | |
|---|---|---|---|
| 2023/0036775 A1* | 2/2023 | Goto | H03H 9/145 |
| 2023/0299740 A1* | 9/2023 | Weng | H03H 9/25 |
| | | | 333/193 |
| 2023/0344408 A1* | 10/2023 | Torazawa | H03H 9/14502 |
| 2024/0039508 A1* | 2/2024 | Zheng | H03H 9/02818 |

* cited by examiner

SURFACE ACOUSTIC WAVE RESONATOR DEVICE AND METHOD FOR MANUFACTURING THE SAME AND FILTER

CROSS-REFERENCE TO RELATED APPLICATION(S)

The application claims priority to the Chinese patent application No. 202311345399.2, filed on Oct. 18, 2023, the entire disclosure of which is incorporated herein by reference as part of the present application.

TECHNICAL FIELD

The embodiments of the present disclosure relate to a surface acoustic wave resonator device and a method for manufacturing the same, and a filter.

BACKGROUND

With the rapid development of mobile communication technologies, filters based on resonators are more and more widely and extensively applied in communication devices such as smart phones. As a kind of acoustic wave filter, surface acoustic wave (SAW) filter has the advantages of small volume and light weight, etc., and is widely used in current communication devices. Among the SAW filters, temperature compensated SAW (TC-SAW) filter has the characteristics of high quality factor, low loss and small temperature drift, and hence has excellent performance. How to improve a resonant temperature coefficient of frequency of the filter through a temperature compensation layer is an important research topic in this field.

SUMMARY

At least one embodiment of the present disclosure provides a surface acoustic wave resonator device, including: a piezoelectric substrate; an interdigital transducer, disposed on the piezoelectric substrate and including a first interdigital electrode structure and a second interdigital electrode structure, wherein the first interdigital electrode structure includes a first interdigital electrode and a first interdigital electrode lead-out part connected with each other, the second interdigital electrode structure includes a second interdigital electrode and a second interdigital electrode lead-out part connected with each other; the first interdigital electrode and the second interdigital electrode extend along a first direction and are arranged along a second direction; and a first temperature compensation layer, disposed on the piezoelectric substrate and including a body part and a protruding part, wherein the body part covers a sidewall of the interdigital transducer and a surface of the interdigital transducer at a side away from the piezoelectric substrate, the protruding part is protruded from the body part towards the piezoelectric substrate in a third direction perpendicular to a main surface of the piezoelectric substrate, and is surrounded by the piezoelectric substrate in a direction parallel to the main surface of the piezoelectric substrate, wherein the piezoelectric substrate includes a first piezoelectric part and a second piezoelectric part, and a first piezoelectric surface of the first piezoelectric part is in contact with a first electrode surface of the first interdigital electrode structure and extends continuously along the first electrode surface, and a second piezoelectric surface of the second piezoelectric part is in contact with a second electrode surface of the second interdigital electrode structure and extends continuously along the second electrode surface.

In the surface acoustic wave resonator device provided by at least one embodiment of the present disclosure, a contact area between the first interdigital electrode structure and the first piezoelectric part is equal to an area of the first electrode surface; or a contact area between the second interdigital electrode structure and the second piezoelectric part is equal to an area of the second electrode surface.

In the surface acoustic wave resonator device provided by at least one embodiment of the present disclosure, the first piezoelectric surface and the second piezoelectric surface are spaced apart from each other by the protruding part of the first temperature compensation layer.

In the surface acoustic wave resonator device provided by at least one embodiment of the present disclosure, the piezoelectric substrate further includes a third piezoelectric part overlapped with the protruding part of the first temperature compensation layer in the third direction; and a height of the first piezoelectric part and a height of the second piezoelectric part are greater than a height of the third piezoelectric part.

In the surface acoustic wave resonator device provided by at least one embodiment of the present disclosure, a surface of the protruding part at a side close to the piezoelectric substrate in the third direction is in contact with the third piezoelectric part, and sidewall s of the protruding part is in contact with the first piezoelectric part and the second piezoelectric part.

In the surface acoustic wave resonator device provided by at least one embodiment of the present disclosure, the first piezoelectric part and the second piezoelectric part are spaced apart from each other by the third piezoelectric part.

In the surface acoustic wave resonator device provided by at least one embodiment of the present disclosure, a contact area between the first temperature compensation layer and the piezoelectric substrate is larger than an area of an orthographic projection of the third piezoelectric part on the main surface of the piezoelectric substrate.

In the surface acoustic wave resonator device provided by at least one embodiment of the present disclosure, an orthographic projection of the protruding part of the first temperature compensation layer on the main surface of the piezoelectric substrate is offset from an orthographic projection of the interdigital transducer on the main surface of the piezoelectric substrate.

In the surface acoustic wave resonator device provided by at least one embodiment of the present disclosure, the protruding part of the first temperature compensation layer includes a main protrusion and a plurality of sub-protrusions, the main protrusion is connected to the body part, and the plurality of sub-protrusions are located on a side of the main protrusion away from the body part in the third direction and are embedded in a third piezoelectric part of the piezoelectric substrate.

In the surface acoustic wave resonator device provided by at least one embodiment of the present disclosure, a part of the plurality of sub-protrusions are arranged at intervals along the first direction, and orthographic projections of the part of the plurality of sub-protrusions on the main surface of the piezoelectric substrate are located between orthographic projections of the first interdigital electrode and the second interdigital electrode on the main surface of the piezoelectric substrate in the second direction, the first interdigital electrode and the second interdigital electrode are adjacent to each other.

In the surface acoustic wave resonator device provided by at least one embodiment of the present disclosure, when viewed from a top view, a contour shape of the first piezoelectric part is as same as a contour shape of the first interdigital electrode structure, and a contour shape of the second piezoelectric part is as same as a contour shape of the second interdigital electrode structure.

In the surface acoustic wave resonator device provided by at least one embodiment of the present disclosure, the first piezoelectric part includes a first strip-shaped piezoelectric part and a first block-shaped piezoelectric part that are in contact with the first interdigital electrode and the first interdigital electrode lead-out part respectively, and the first strip-shaped piezoelectric part and the first block-shaped piezoelectric part are directly connected to each other; and/or the second piezoelectric part includes a second strip-shaped piezoelectric part and a second block-shaped piezoelectric part that are in contact with the second interdigital electrode and the second interdigital electrode lead-out part respectively, and the second strip-shaped piezoelectric part and the second block-shaped piezoelectric part are directly connected to each other.

In the surface acoustic wave resonator device provided by at least one embodiment of the present disclosure, the first temperature compensation layer includes a first temperature compensation sub-layer and a second temperature compensation sub-layer, the first temperature compensation sub-layer is at least located in the body part, and covers a sidewall of the interdigital transducer and a surface of the interdigital transducer at a side away from the piezoelectric substrate, and the interdigital transducer is spaced apart from the second temperature compensation sub-layer by the first temperature compensation sub-layer.

In the surface acoustic wave resonator device provided by at least one embodiment of the present disclosure, the first temperature compensation sub-layer further extends to cover a portion of a surface of the piezoelectric substrate, and the second temperature compensation sub-layer is spaced apart from the piezoelectric substrate by the first temperature compensation sub-layer.

In the surface acoustic wave resonator device provided by at least one embodiment of the present disclosure, the first temperature compensation sub-layer has an opening, and the second temperature compensation sub-layer passes through the opening to be in contact with the piezoelectric substrate.

In the surface acoustic wave resonator device provided by at least one embodiment of the present disclosure, the protruding part of the first temperature compensation layer includes a portion of the first temperature compensation sub-layer and a portion of the second temperature compensation sub-layer; the portion of the first temperature compensation sub-layer covers a sidewall of the first piezoelectric part and a sidewall of the second piezoelectric part; and the portion of the second temperature compensation sub-layer is in direct contact with a third piezoelectric part of the piezoelectric substrate.

In the surface acoustic wave resonator device provided by at least one embodiment of the present disclosure, the protruding part of the first temperature compensation layer includes a portion of the second temperature compensation sub-layer, and the portion of the second temperature compensation sub-layer is located on a third piezoelectric part of the piezoelectric substrate and is in contact with a sidewall of the first piezoelectric part and a sidewall of the second piezoelectric part.

The surface acoustic wave resonator device provided by at least one embodiment of the present disclosure, further includes: a clutter suppression structure, disposed on a side of the first temperature compensation layer away from the piezoelectric substrate.

The surface acoustic wave resonator device provided by at least one embodiment of the present disclosure, further includes: a second temperature compensation layer, disposed on the side of the first temperature compensation layer away from the piezoelectric substrate and covering the clutter suppression structure.

At least one embodiment of the present disclosure provides a filter, including any one of abovementioned surface acoustic wave resonator devices.

At least one embodiment of the present disclosure provides a method for manufacturing a surface acoustic wave resonator device, including: providing a piezoelectric substrate; forming an interdigital transducer on the piezoelectric substrate, wherein the interdigital transducer includes a first interdigital electrode structure and a second interdigital electrode structure, the first interdigital electrode structure includes a first interdigital electrode and a first interdigital electrode lead-out part connected with each other, the second interdigital electrode structure includes a second interdigital electrode and a second interdigital electrode lead-out part connected with each other; the first interdigital electrode and the second interdigital electrode extend along a first direction and are arranged along a second direction; the piezoelectric substrate has a first piezoelectric region, a second piezoelectric region and a third piezoelectric region, the first piezoelectric region and the second piezoelectric region are respectively covered by the first interdigital electrode structure and the second interdigital electrode structure, and the third piezoelectric region is exposed by the interdigital transducer; performing an etching process on the piezoelectric substrate using the interdigital transducer as an etching mask, so as to remove a portion of the piezoelectric substrate located in the third piezoelectric region, and after the etching process is performed, the piezoelectric substrate includes a first piezoelectric part, a second piezoelectric part and a third piezoelectric part respectively located in the first piezoelectric region, the second piezoelectric region and the third piezoelectric region, and a height of the third piezoelectric part is smaller than a height of the first piezoelectric part and a height of the second piezoelectric part; and forming a first temperature compensation layer on the piezoelectric substrate, wherein the first temperature compensation layer includes a body part and a protruding part, the body part covers a sidewall of the interdigital transducer and a surface of the interdigital transducer at a side away from the piezoelectric substrate, the protruding part is protruded from the body part towards the piezoelectric substrate in a third direction perpendicular to a main surface of the piezoelectric substrate and is surrounded by the piezoelectric substrate in a direction parallel to the main surface of the piezoelectric substrate.

In the method for manufacturing the surface acoustic wave resonator device provided by at least one embodiment of the disclosure, portions of the piezoelectric substrate located in the first piezoelectric region and the second piezoelectric region are not removed in the etching process.

In the method for manufacturing the surface acoustic wave resonator device provided by at least one embodiment of the disclosure, the etching process only uses the interdigital transducer as the etching mask, and removed portions of the third piezoelectric part in different regions have a same height.

In the method for manufacturing the surface acoustic wave resonator device provided by at least one embodiment of the disclosure, the etching process includes: performing a first etching process using the interdigital transducer as a first etching mask to remove a portion of the piezoelectric substrate exposed by the interdigital transducer; and performing a second etching process using the interdigital transducer and an additional mask collectively as a second etching mask, so as to further remove portions of the third piezoelectric part exposed by the second etching mask, wherein the additional mask includes a plurality of mask openings exposing the portions of the third piezoelectric region.

In the method for manufacturing the surface acoustic wave resonator device provided by at least one embodiment of the disclosure, forming the first temperature compensation layer includes: forming a first temperature compensation sub-layer to at least cover a sidewall of the interdigital transducer and a surface of the interdigital transducer at a side away from the piezoelectric substrate; and forming a second temperature compensation sub-layer on the piezoelectric substrate and on the first temperature compensation sub-layer.

In the method for manufacturing the surface acoustic wave resonator device provided by at least one embodiment of the disclosure, forming the first temperature compensation sub-layer includes: forming the first temperature compensation sub-layer on the piezoelectric substrate and on the interdigital transducer; and forming an opening in the first temperature compensation sub-layer to expose a portion of the piezoelectric substrate located in the third piezoelectric region.

In the method for manufacturing the surface acoustic wave resonator device provided by at least one embodiment of the disclosure, both the first temperature compensation sub-layer and the second temperature compensation sub-layer are formed after the etching process.

In the method for manufacturing the surface acoustic wave resonator device provided by at least one embodiment of the disclosure, the first temperature compensation sub-layer is formed before the etching process, and the second temperature compensation sub-layer is formed after the etching process.

BRIEF DESCRIPTION OF THE DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1A:
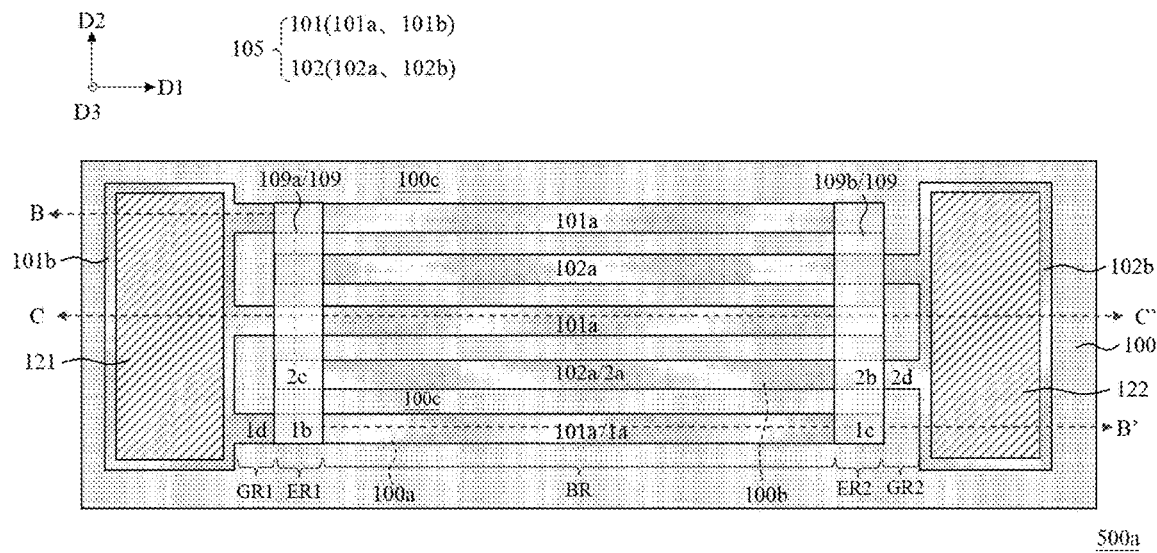
FIG. 1A illustrates a schematic top view of a surface acoustic wave resonator device according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection" "connected", and the like are not limited to physical or mechanical connection but may include electrical connection, either directly or indirectly.

The embodiments of the present disclosure provide a surface acoustic wave resonator device, a manufacturing method thereof and a filter. The surface acoustic wave resonator device includes: a piezoelectric substrate; an interdigital transducer disposed on the piezoelectric substrate and including a first interdigital electrode structure and a second interdigital electrode structure, wherein the first interdigital electrode structure includes a first interdigital electrode and a first interdigital electrode lead-out part connected with each other, and the second interdigital electrode structure includes a second interdigital electrode and a second interdigital electrode lead-out part connected with each other, the first interdigital electrode and the second interdigital electrode extend along a first direction and are arranged along a second direction; and a first temperature compensation layer disposed on the piezoelectric substrate and including a body part and a protruding part, wherein the body part covers a sidewall of the interdigital transducer and a surface of the interdigital transducer at a side away from the piezoelectric substrate, the protruding part is protruded from the body part and towards the piezoelectric substrate in a third direction perpendicular to a main surface of the piezoelectric substrate and is surrounded by the piezoelectric substrate in a direction parallel to the main surface of the piezoelectric substrate, wherein the piezoelectric substrate includes a first piezoelectric part and a second piezoelectric part, a first piezoelectric surface of the first piezoelectric part and a second piezoelectric surface of the second piezoelectric part are respectively in contact with a first electrode surface of the first interdigital electrode structure and a second electrode surface of the second interdigital electrode structure and extend continuously along the first electrode surface and the second electrode surface, respectively.

In the embodiments of the present disclosure, at least the following technical effects can be achieved through the above configurations of the surface acoustic wave resonator: by configuring the first temperature compensation layer to be provided with the protruding part, a contact area between the temperature compensation layer and the piezoelectric substrate can be increased, thereby improving the temperature coefficient of frequency (TCF) of the resonator device and a filter including the resonator device; moreover, the piezoelectric surfaces of the first piezoelectric part and the second piezoelectric part of the piezoelectric substrate that are respectively in contact with the electrode surfaces of the first electrode structure and the second electrode structure are respectively configured to extend continuously, so that the stability, reliability and other performances of an acoustic-electrical energy conversion between the interdigital transducer and the piezoelectric substrate can be ensured. That is to say, the embodiment of the present disclosure can improve the temperature coefficient of frequency of the resonator device and the filter including the resonator device, while ensuring the stability, reliability and other performances of the acoustic-electrical energy conversion.

Figure 1B:
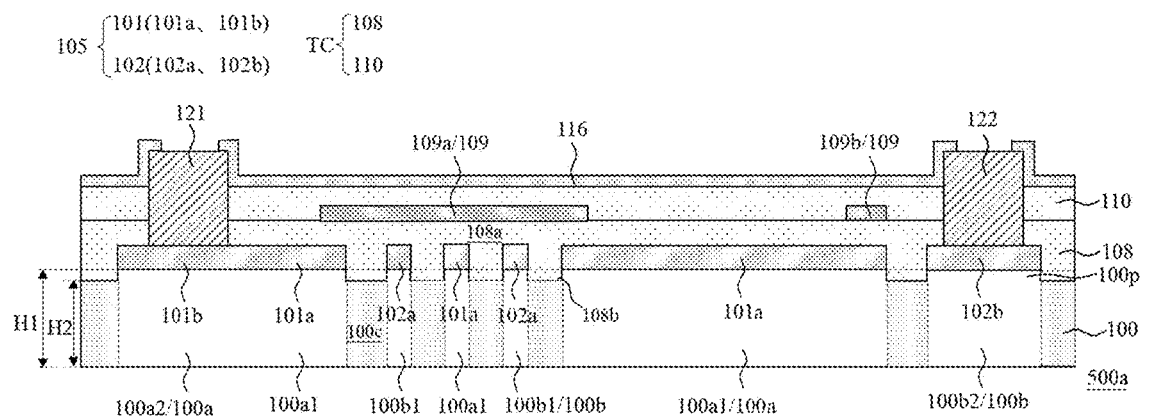
FIG. 1B and FIG. 1C illustrate schematic cross-sectional views of a surface acoustic wave resonator device according to some embodiments of the present disclosure, taken along a line B-B' and a line C-C' of FIG. 1A, respectively.
Figure 1C:
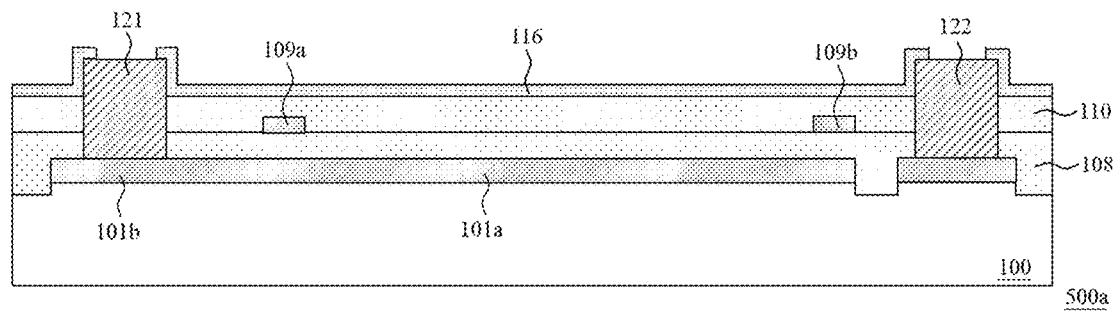

FIG. 1A illustrates a schematic top view of a surface acoustic wave resonator device according to some embodiments of the present disclosure; FIG. 1B and FIG. 1C illustrate schematic cross-sectional views of a surface acoustic wave resonator device according to some embodiments of the present disclosure, taken along a line B-B' and a line C-C of FIG. 1A, respectively.

Referring to FIG. 1A to FIG. 1C, in some embodiments, a surface acoustic wave resonator device 500a may be or may include a temperature compensated SAW (TC-SAW) resonator. For example, the surface acoustic wave resonator device 500a includes a piezoelectric substrate 100, an interdigital transducer (IDT) 105, a temperature compensation structure TC, a first conductive connector 121, a second conductive connector 112b, and a passivation layer 116. The temperature compensation structure TC may be a single-layered structure or a multi-layered structure. In some embodiments, the temperature compensation structure TC is a multi-layered structure including a plurality of temperature compensation layers. For example, the temperature compensation structure TC may include a first temperature compensation layer 108 and a second temperature compensation layer 110.

In some embodiments, the interdigital transducer 105 is disposed on a side of the piezoelectric substrate 100 and includes a first interdigital electrode structure 101 and a second interdigital electrode structure 102. The first interdigital electrode structure 101 and the second interdigital electrode structure 102 are electrically isolated from each other. For example, the first interdigital electrode structure 101 includes one or more first interdigital electrodes 101a and a first interdigital electrode lead-out part 101b; the second interdigital electrode structure 102 includes one or more second interdigital electrodes 102a and a second interdigital electrode lead-out part 102b. The first interdigital electrodes 101a and the second interdigital electrodes 102a may extend substantially parallel to each other along a first direction D1, and may be alternately arranged along a second direction D2 and spaced apart from each other. The first interdigital electrode lead-out part 101b and the second interdigital electrode lead-out part 102b are located on two opposite sides of the plurality of interdigital electrodes in the first direction D1, and are connected with the corresponding interdigital electrodes.

For example, a plurality of first interdigital electrodes 101a may be arranged at intervals along the second direction D2, and electrically connected to each other through the first interdigital electrode lead-out part 101b; a plurality of second interdigital electrodes 102a may be arranged at intervals along the second direction D2, and electrically connected to each other through the second interdigital electrode lead-out part 102b. Among the first interdigital electrodes 101a and the second interdigital electrodes 102a, each interdigital electrode has a first edge and a second edge opposite to each other in the first direction D1. For example, first edges of the plurality of first interdigital electrodes 101a are connected with the first interdigital electrode lead-out part 101b, and second edges of the plurality of first interdigital electrodes 101a face the second interdigital electrode lead-out part 102b and are spaced apart from the second interdigital electrode lead-out part 102b. First edges of the plurality of second interdigital electrodes 102a are connected with the second interdigital electrode lead-out part 102b, and second edges of the plurality of second interdigital electrodes 102a face the first interdigital electrode lead-out part 101b and are spaced apart from the first interdigital electrode lead-out part 101b.

The first temperature compensation layer 108 is disposed on the piezoelectric substrate 100, and includes a body part 108a and a protruding part 108b. The body part 108a covers sidewalls of the interdigital transducer 105 and a surface of the interdigital transducer 105 at a side away from the piezoelectric substrate 100. The protruding part 108b is protruded from the body part 108a and towards the piezoelectric substrate 100 in a third direction D3 perpendicular to a main surface of the piezoelectric substrate 100, and is surrounded by the piezoelectric substrate 100 in a direction (for example, a horizontal direction including the first direction D1 and the second direction D2) parallel to the main surface of the piezoelectric substrate 100. Herein, the main surface of the piezoelectric substrate may be a surface of the piezoelectric substrate which is close to the interdigital transducer and extends in a horizontal direction as illustrated in the figure (i.e., a horizontally extending part of the top surface as illustrated in the figure), or may also be a surface of the piezoelectric substrate at a side away from the interdigital transducer (i.e., the bottom surface as illustrated in the figure). The third direction D3 is perpendicular to a plane where the first direction D1 and the second direction D2 are located; for instance, in some examples, the first direction D1 and the second direction D2 are horizontal directions, and the third direction D3 is a vertical direction.

In some embodiments, the piezoelectric substrate 100 includes a first piezoelectric part 100a, a second piezoelectric part 100b and a third piezoelectric part 100c. The first piezoelectric part 100a and the second piezoelectric part 100b are respectively covered by the first interdigital electrode structure 101 and the second interdigital electrode structure 102 of the interdigital transducer; the third piezoelectric part 100c is exposed by the interdigital transducer 105 and is covered by the protruding part 108b of the first temperature compensation layer 108. That is, the first piezoelectric part 100a, the second piezoelectric part 100b and the third piezoelectric part 100c may be overlapped with the first interdigital electrode structure 101, the second interdigital electrode structure 102 and the protruding part 108b of the first temperature compensation layer 108 in the third direction D3, respectively. For example, a first piezoelectric surface (i.e., the top surface illustrated in the figure) of the first piezoelectric part 100a is in contact with a first electrode surface (i.e., the bottom surface illustrated in the figure) of the first interdigital electrode structure 101; a second piezoelectric surface (i.e., the top surface illustrated in the FIGURE) of the second piezoelectric part 100b is in contact with a second electrode surface (i.e., the bottom surface illustrated in the figure) of the second interdigital electrode structure 102; and the first and second piezoelectric surfaces extend continuously along the first and second electrode surfaces, respectively. At least a portion of the protruding part of the first temperature compensation layer may be located between the first piezoelectric surface and the second piezoelectric surface in a direction parallel to the main surface of the piezoelectric substrate and separate the first piezoelectric surface from the second piezoelectric surface.

In some embodiments, a contact area between the interdigital transducer 105 and the piezoelectric substrate 100 is approximately equal to an area of a surface (i.e., the bottom surface illustrated in the figure) of the interdigital transducer 105 at a side close to the piezoelectric substrate. Specifically, a contact area between the first interdigital electrode structure 101 and the first piezoelectric part 100a of the piezoelectric substrate 100 is approximately equal to an area of a surface (i.e., the first electrode surface) of the first interdigital electrode structure 101 at a side close to the piezoelectric substrate. A contact area between the second interdigital electrode structure 102 and the second piezoelectric part 100b of the piezoelectric substrate 100 may be approximately equal to an area of a surface (i.e., the second electrode surface) of the second interdigital electrode structure 102 at a side close to the piezoelectric substrate.

For example, the first electrode surface includes surfaces of the first interdigital electrodes 101a and the first interdigital electrode lead-out part 101b at a side close to the piezoelectric substrate 100, and an area of the first piezoelectric surface may be approximately equal to an area of the first electrode surface. The second electrode surface includes surfaces of the second interdigital electrodes 102a and the second interdigital electrode lead-out part 102b at a side close to the piezoelectric substrate 100, and an area of the second piezoelectric surface may be approximately equal to an area of the second electrode surface. In some embodiments, the first piezoelectric surface of the first piezoelectric part 100a and the second piezoelectric surface of the second piezoelectric part 100b may be spaced apart from each other by the protruding part 108b of the first temperature compensation layer 108.

In some embodiments, the first piezoelectric part 100a and the second piezoelectric part 100b may have substantially the same first height H1, the third piezoelectric part 100c has a second height H2, and the first height H1 is greater than the second height H2. Herein, the height of each piezoelectric part refers to a thickness of the piezoelectric part in the third direction D3, that is, a distance between the top surface and the bottom surface of the piezoelectric part in the third direction D3. A thickness of the protruding part 108b of the first temperature compensation layer 108 in the third direction D3 is approximately equal to a difference between the first height H1 and the second height H2. In some embodiments, a ratio of the difference between the first height H1 and the second height H2 to the first height H1 may be greater than zero and smaller than or equal to ⅓. Setting the difference between the first height H1 and the second height H2 in the above-mentioned range can ensure the structural stability of the piezoelectric substrate as well as the reliability and stability of the acoustic-electrical energy conversion between the interdigital transducer and the piezoelectric substrate, while improving the temperature compensation performance of the resonator device.

In other words, the first piezoelectric part 100a and the second piezoelectric part 100b have piezoelectric protrusions 100p which are protruded towards the interdigital transducer 105 with respect to a main surface of the third piezoelectric part 100c in a third direction perpendicular to a main surface of the piezoelectric substrate. A thickness of the piezoelectric protrusion 100p in the third direction is approximately equal to the difference between the first height H1 and the second height H2.

In some embodiments, a sidewall of the interdigital transducer 105 may be substantially aligned with a corresponding sidewall of the piezoelectric protrusion 100p in the third direction. For example, a sidewall of the first interdigital electrode structure 101 may be substantially aligned with a sidewall of the piezoelectric protrusion 100p of the first piezoelectric part 100a in the third direction; a sidewall of the second interdigital electrode structure 102 may be substantially aligned with a sidewall of the piezoelectric protrusion 100p of the second piezoelectric part 100b in the third direction, but the present disclosure is not limited thereto.

The protruding part 108b of the first temperature compensation layer 108 is located on the third piezoelectric part 100c in the third direction D3 perpendicular to the main surface of the piezoelectric substrate, and located laterally aside the first piezoelectric part 100a and the second piezoelectric part 100b in a direction (for example, a horizontal direction including the first direction D1 and the second direction D2) parallel to the main surface of the piezoelectric substrate. That is to say, the protruding part 108b of the first temperature compensation layer 108 may be overlapped with portions (for example, the piezoelectric protrusions 100p) of the first piezoelectric part 100a and the second piezoelectric part 100b in a direction parallel to the main surface of the piezoelectric substrate.

For example, a surface (i.e., the bottom surface illustrated in the figure) of the protruding part 108b of the first temperature compensation layer 108 at a side close to the piezoelectric substrate in the third direction D3 is in contact with the third piezoelectric part 100c; and a sidewall of the protruding part 108b is in contact with the first piezoelectric part 100a and the second piezoelectric part 100b, for example, in contact with sidewalls of the piezoelectric protrusions 100p of the first piezoelectric part and the second piezoelectric part. That is, a contact area between the first temperature compensation layer 108 and the piezoelectric substrate 100 is larger than an area of an orthographic projection of the third piezoelectric part 100c on the main surface of the piezoelectric substrate 100, and the area of the orthographic projection of the third piezoelectric part is approximately equal to an area of the top surface thereof. In the embodiment of the present disclosure, the first temperature compensation layer 108 is configured to have a protruding part, and the protruding part is embedded in the piezoelectric substrate, so that both sidewalls of the protruding part and a surface of the protruding part at a side close to the piezoelectric substrate in the third direction are in contact with the piezoelectric substrate, thereby increasing the contact area between the temperature compensation layer and the piezoelectric substrate. As a result, it's beneficial to improving the temperature coefficient of frequency of the resonator device and the filter including the resonator device.

In some embodiments, orthographic projections of the protruding part 108b of the first temperature compensation layer 108 and the third piezoelectric part 100c on a main surface (e.g., the bottom surface illustrated in the figure) of the piezoelectric substrate 100 are offset from (i.e., not overlapped with) an orthographic projection of the interdigital transducer 105 on the main surface of the piezoelectric substrate 100. The orthographic projections of the protruding part 108b and the third piezoelectric part 100c may be adjoined with the orthographic projection of the interdigital transducer 105. Such a configuration can ensure that the piezoelectric part in contact with each interdigital electrode structure of the interdigital transducer is continuous, so as to guarantee the stability and reliability of electro-acoustic energy conversion of the interdigital transducer, and at the same time further to maximize the contact area between the temperature compensation layer and the piezoelectric substrate and improve the temperature coefficient of frequency of the resonator device and the filter.

Figure 5A:
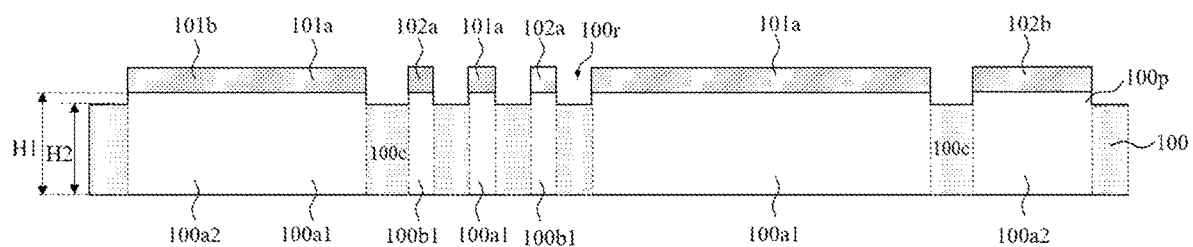
Figure 5B:
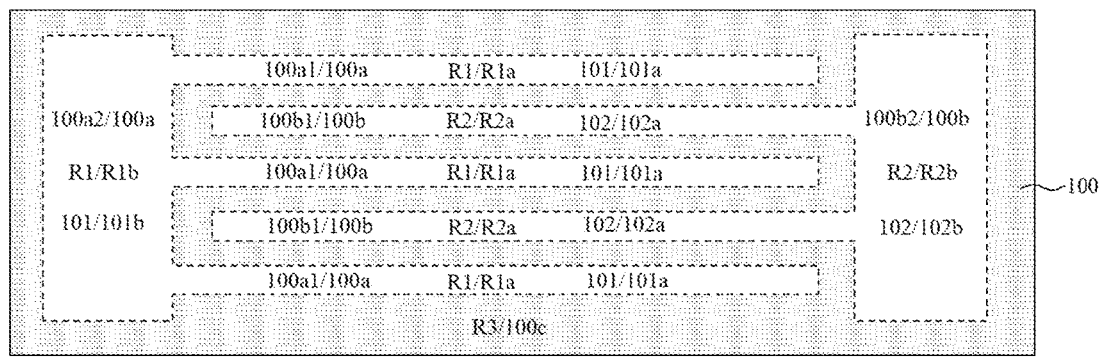

FIG. 5B illustrates a top view of the piezoelectric substrate 100, in which an orthographic projection of the interdigital transducer on the piezoelectric substrate is also illustrated.

Referring to FIG. 1A, FIG. 1B and FIG. 5B, in some embodiments, when viewed in a top view, a contour shape of the first piezoelectric part 100a may be substantially the same as a contour shape of the first interdigital electrode structure 101, and a contour shape of the second piezoelectric part 100b may be substantially the same as a contour shape of the second interdigital electrode structure 102. That is to say, contour shapes of orthographic projections of the first piezoelectric part 100a and the second piezoelectric part 100b on the main surface of the piezoelectric substrate may be approximately the same as contour shapes of orthographic projections of the first interdigital electrode structure 101 and the second interdigital electrode structure 102 on the main surface of the piezoelectric substrate, respectively. For example, orthographic projections of the first piezoelectric part 100a and the second piezoelectric part 100b on a main surface of the piezoelectric substrate at a side away from the interdigital transducer may coincide with orthographic projections of the first interdigital electrode structure 101 and the second interdigital electrode structure 102 on the main surface of the piezoelectric substrate, respectively. The third piezoelectric part 100c is the rest portion of the piezoelectric substrate 100 other than the first piezoelectric part and the second piezoelectric part, and a portion of the third piezoelectric part 100c may be located between the first piezoelectric part and the second piezoelectric part, so that the first piezoelectric part 100a and the second piezoelectric part 100b may be spaced apart from each other by the third piezoelectric part 100c; the third piezoelectric part 100c may further be located in a region close to an edge of the piezoelectric substrate 100.

For example, in the first piezoelectric part 100a and the second piezoelectric part 100b, each piezoelectric part includes one or more strip-shaped piezoelectric parts and one block-shaped piezoelectric part. The strip-shaped piezoelectric parts are disposed in one-to-one correspondence with and in contact with the corresponding interdigital electrodes; and orthographic projections of the strip-shaped piezoelectric part and the corresponding interdigital electrode on the main surface of the piezoelectric substrate may coincide with each other and have approximately the same area. Corresponding sidewalls of the strip-shaped piezoelectric part and the interdigital electrode are approximately aligned with each other in the third direction. The block-shaped piezoelectric part is disposed in correspondence to and in contact with a corresponding interdigital electrode lead-out part, and orthographic projections of the block-shaped piezoelectric part and the corresponding interdigital electrode lead-out part on the main surface of the piezoelectric substrate coincide with each other and may have approximately the same area. Corresponding sidewalls of the block-shaped piezoelectric part and the interdigital electrode lead-out part may be substantially aligned with each other in the third direction.

For example, the first piezoelectric part 100a may include one or more first strip-shaped piezoelectric parts 100a1 and a first block-shaped piezoelectric part 100a2, in which the one or more first strip-shaped piezoelectric parts 100a1 are disposed in correspondence with and in contact with one or more first interdigital electrodes 101a, and the first block-shaped piezoelectric part 100a2 is disposed in correspondence with and in contact with the first interdigital electrode lead-out part 101b. The second piezoelectric part 100b may include one or more second strip-shaped piezoelectric parts 100b1 and a second block-shaped piezoelectric part 100b2, in which the one or more second strip-shaped piezoelectric parts 100b1 are disposed in correspondence with and in contact with one or more second interdigital electrodes 102a, and the second block-shaped piezoelectric part 100b2 is disposed in correspondence with and in contact with the second interdigital electrode lead-out part 102b. The first strip-shaped piezoelectric parts 100a1 and the first block-shaped piezoelectric part 100a2 are directly connected, that is, the first piezoelectric part 100a is a continuous part of the piezoelectric substrate. The second strip-shaped piezoelectric parts 100b1 and the second block-shaped piezoelectric part 100b2 are directly connected, that is, the second piezoelectric part 100b is a continuous part of the piezoelectric substrate.

Referring to FIG. 1A to FIG. 1C, the surface acoustic wave resonator device 500a has an interdigital electrode region and lead-out regions, and the lead-out regions are disposed at two opposite sides of the interdigital electrode region in the first direction D1. A plurality of interdigital electrodes may be disposed in the interdigital electrode region. The first interdigital electrode lead-out part 101a and the second interdigital electrode lead-out part 102b are respectively disposed in the lead-out regions on two opposite sides of the interdigital electrode region. For example, the interdigital electrode region may include an interdigital electrode body region BR, a first end region ER1, a second end region ER2, a first extension region GR1 and a second extension region GR2. The first end region ER1 and the second end region ER2 are located on two opposite sides of the interdigital electrode body region BR in the first direction D1 and are connected with the interdigital electrode body region BR. The first extension region GR1 is located on a side of the first end region ER1 away from the interdigital electrode body region BR in the first direction D1, and is located between the first end region ER1 and a first lead-out region. The second extension region GR2 is located on a side of the second end region ER2 away from the interdigital electrode body region BR in the first direction D1, and is located between the second end region ER2 and a second lead-out region.

In some embodiments, each interdigital electrode includes a central part located in the interdigital electrode body region BR, a first end part located in one of the first and second end regions ER1 and ER2, a second end part located in the other one of the first and second end regions ER1 and ER2, and an extension part located in one of the first and second extension regions GR1 and GR2. In each interdigital electrode, the first end part and the second end part are located on two opposite sides of the central part in a first direction (for example, the direction D1), and the extension part is located on a side of the first end part away from the central part and connected to the corresponding interdigital electrode lead-out part. It should be understood that the central part, the first end part, the second end part and the extension part of each interdigital electrode are connected with each other and are continuous, and may be integrally formed. In some embodiments, in each interdigital electrode structure, the interdigital electrode and the interdigital electrode lead-out part may also be integrally formed. The first end part and the second end part of the interdigital electrode may be collectively referred to as an end portion of the interdigital electrode.

For example, the first interdigital electrode 101a includes a central part 1a, a first end part 1b, a second end part 1c and an extension part 1d; the second interdigital electrode 102a includes a central part 2a, a first end part 2b, a second end part 2c and an extension part 2d. The central parts 1a of the first interdigital electrodes 101a and the central parts 2a of the second interdigital electrodes 102a are alternately arranged along a second direction D2 in the interdigital electrode body region BR. The first end parts 1b of the first interdigital electrodes 101a and the second end parts 2c of the second interdigital electrodes 102a are alternately arranged along the second direction D2 in the first end region ER1. The second end parts 1c of the first interdigital electrodes 101a and the first end parts 2b of the second interdigital electrodes 102a are alternately arranged in the second direction D2 in the second end region ER2. The extension parts 1d of the first interdigital electrodes 101a are located in the first extension region GR. The second interdigital electrodes 102a have no portions disposed in the first extension region GR1, and the second interdigital electrodes 102a are spaced apart from the first interdigital electrode lead-out part 101b by the first extension region GR1. The extension parts 2d of the second interdigital electrodes 102a are located in the second extension region GR2. The first interdigital electrodes 101a may have no portions disposed in the second extension region GR2, and the first interdigital electrodes 101a are spaced apart from the second interdigital electrode lead-out part 102b by the second extension region GR2.

Referring to FIG. 1A to FIG. 1C and FIG. 5B, in some embodiments, the first piezoelectric part 100a of the piezoelectric substrate 100 continuously extends in the interdigital electrode body region BR, the first end region ER1, the second end region ER2, the first extension region GR1 and the first lead-out region; and the central part 1a, the first end part 1b, the second end part 1c and the extension part 1d of each first interdigital electrode 101a are all in connect with the first strip-shaped piezoelectric part 100a1 of the first piezoelectric part 100a; the first interdigital electrode lead-out part 101b is in contact with the first block-shaped piezoelectric part 100a2 of the first piezoelectric part 100a; a contact interface between the first interdigital electrode 101a and the first piezoelectric part 100a and a contact interface between the first interdigital electrode lead-out part 101b and the first piezoelectric part 100a are connected and continuous with each other.

Similarly, the second piezoelectric part 100a of the piezoelectric substrate 100 continuously extends in the interdigital electrode body region BR, the first end region ER1, the second end region ER2, the second extension region GR2 and the second lead-out region; the central part 2a, the first end part 2b, the second end part 2c and the extension part 2d of each second interdigital electrode 102a are all in contact with the second strip-shaped piezoelectric part 100a2 of the second piezoelectric part 100a; the second interdigital electrode lead-out part 102b is in contact with the second block-shaped piezoelectric part 100b2 of the second piezoelectric part 100b; a contact interface between the second interdigital electrode 102a and the second piezoelectric part 100b and a contact interface between the second interdigital electrode lead-out part 102b and the second piezoelectric part 100b are connected and continuous with each other.

In the embodiment of the present disclosure, in the interdigital transducer, a contact interface between the first interdigital electrode structure and the piezoelectric substrate, as well as a contact interface between the second interdigital electrode structure and the piezoelectric substrate are configured to be continuous, which can ensure the performance of the resonator device in the aspect of acoustic-electrical energy conversion and avoid the adverse influence on the performance of the interdigital transducer due to the configuration of the protruding part of the temperature compensation layer.

Still referring to FIG. 1A to FIG. 1C, in some embodiments, the surface acoustic wave resonator device 500a further includes a clutter suppression structure 109 to suppress the formation and/or propagation of transverse wave in spurious mode (i.e., clutter). The clutter suppression structure 109 is disposed on a side of the first temperature compensation layer 108 away from the piezoelectric substrate 100, and may include a first clutter suppression layer 109a and a second clutter suppression layer 109b. The first and second clutter suppression layers 109a and 109b may be disposed in the first and second end regions ER1 and ER2 of the interdigital electrode region respectively, and extend across end portions of a plurality of interdigital electrodes along the second direction D2. For example, the first clutter suppression layer 109a may be overlapped with the first end parts 1b of the plurality of first interdigital electrodes 101a and the second end parts 2c of the plurality of second interdigital electrodes 102a in the third direction D3, and may be overlapped with a portion of the protruding part 108b of the first temperature compensation layer 108 (for example, a portion located between the end parts of adjacent interdigital electrodes in the second direction) in the third direction D3. The second clutter suppression layer 109b may be overlapped with the second end parts 1c of the plurality of first interdigital electrodes 102a and the first end parts 2b of the plurality of second interdigital electrodes in the third direction D3, and may be overlapped with a portion of the protruding part b of the first temperature compensation layer 108 (for example, a portion located between the end parts of adjacent interdigital electrodes in the second direction) in the third direction D3. In some embodiments, the clutter suppression structure 109 may include a metal structure, which may be electrically floating, that is, electrically isolated from the interdigital transducer, etc., but the present disclosure is not limited thereto.

In some embodiments, the first clutter suppression layer 109a may have a sidewall aligned with a sidewall of the second interdigital electrode 102*a* in the third direction D3; and the second clutter suppression layer 109*b* may have a sidewall aligned with a sidewall of the first interdigital electrode 101*a* in the third direction D3, but the present disclosure is not limited thereto.

In some embodiments, the temperature compensation structure TC may further include a second temperature compensation layer 110. The clutter suppression structure 109 may be embedded in the temperature compensation structure TC, for example, located between the first temperature compensation layer 108 and the second temperature compensation layer 110. For example, the second temperature compensation layer 110 is disposed on a side of the first temperature compensation layer 108 away from the piezoelectric substrate 100, and covers sidewalls of the clutter suppression structure 109 and a surface of the clutter suppression structure 109 at a side away from the piezoelectric substrate.

In some embodiments, the surface acoustic wave resonator device may further include a first conductive connector 121 and a second conductive connector 122. The first conductive connector 121 and the second conductive connector 122 are disposed on a side of the first interdigital electrode lead-out part 101*b* and the second interdigital electrode lead-out part 102*b* away from the piezoelectric substrate 100, respectively, and are electrically connected with the first interdigital electrode lead-out part 101*b* and the second interdigital electrode lead-out part 102*b*, respectively. The first conductive connector 121 and the second conductive connector 122 may be at least partially overlapped with the first interdigital electrode lead-out part 101*b* and the second interdigital electrode lead-out part 102*b* in a third direction D3 perpendicular to the main surface of the piezoelectric substrate 100, respectively. For example, an orthographic projection of the first conductive connector 121 on the piezoelectric substrate 100 may be located within the range of an orthographic projection of the first interdigital electrode lead-out part 101*b* on the piezoelectric substrate 100; an orthographic projection of the second conductive connector 122 on the piezoelectric substrate 100 may be located within the range of an orthographic projection of the second interdigital electrode lead-out part 102*b* on the piezoelectric substrate 100, but the present disclosure is not limited thereto. Herein, two components being overlapped with each other in a certain direction represents that orthographic projections of the two components on a plane perpendicular to this direction are overlapped with each other. For example, two components being overlapped with each other in a direction perpendicular to the main surface of the piezoelectric substrate represents that orthographic projections of the two components on the main surface of the piezoelectric substrate are overlapped with each other.

In some embodiments, the surface acoustic wave resonator device 500*a* may further include a passivation layer 116, which may be disposed on a side of the temperature compensation structure TC away from the piezoelectric substrate and cover a portion of a surface of the first conductive connector 121 and a portion of a surface of the second conductive connector 122. The passivation layer 116 may have a plurality of openings, and the plurality of openings respectively expose a portion of a surface of the first conductive connector 121 and a portion of a surface of the second conductive connector 122 at a side away from the piezoelectric substrate 100, so as to provide external connection windows. In some embodiments, the second temperature compensation layer 110 may be omitted, that is, the temperature compensation structure TC may only include the first temperature compensation layer 108, and the passivation layer 116 may be formed on a side of the first temperature compensation layer 108 away from the piezoelectric substrate and cover the clutter suppression structure 109, but the present disclosure is not limited thereto.

The embodiment of the present disclosure provides a manufacturing method of a surface acoustic wave resonator device, which includes the following steps: providing a piezoelectric substrate; forming an interdigital transducer on the piezoelectric substrate, wherein the interdigital transducer includes a first interdigital electrode structure and a second interdigital electrode structure, the first interdigital electrode structure includes a first interdigital electrode and a first interdigital electrode lead-out part connected with each other, and the second interdigital electrode structure includes a second interdigital electrode and a second interdigital electrode lead-out part connected with each other, wherein the first interdigital electrode and the second interdigital electrode extend along a first direction and are arranged along a second direction, wherein the piezoelectric substrate has a first piezoelectric region, a second piezoelectric region and a third piezoelectric region, the first piezoelectric region and the second piezoelectric region are covered by the first interdigital electrode structure and the second interdigital electrode structure respectively, and the third piezoelectric region is exposed by the interdigital transducer; performing an etching process on the piezoelectric substrate using the interdigital transducer as an etching mask, so as to remove a portion of the piezoelectric substrate located in the third piezoelectric region, wherein after the etching process, the piezoelectric substrate includes a first piezoelectric part, a second piezoelectric part and a third piezoelectric part respectively located in the first piezoelectric region, the second piezoelectric region and the third piezoelectric region, and a height of the third piezoelectric part is smaller than a height of the first piezoelectric part and the second piezoelectric part; and forming a first temperature compensation layer on the piezoelectric substrate, wherein the first temperature compensation layer includes a body part and a protruding part, wherein the body part covers sidewalls of the interdigital transducer and a surface of the interdigital transducer at a side away from the piezoelectric substrate, and the protruding part is protruded from the body part towards the piezoelectric substrate in a third direction perpendicular to a main surface of the piezoelectric substrate and is surrounded by the piezoelectric substrate in a direction parallel to the main surface of the piezoelectric substrate. The manufacturing method of the surface acoustic wave resonator device according to the embodiment of the present disclosure will be exemplarily described below with reference to the accompanying drawings.

FIG. 2 to FIG. 13 illustrate schematic views of intermediate structures of various steps in the manufacturing method of the surface acoustic wave resonator device 500*a* according to some embodiments of the present disclosure, in which FIG. 2, FIG. 3, FIG. 4A, FIG. 5A and FIG. 6 to FIG. 13 respectively illustrate schematic cross-sectional views of the intermediate structures of various steps in the manufacturing method correspondingly taken along the line B-B' of FIG. 1A; FIG. 4B and FIG. 5B are top views corresponding to FIG. 4A and FIG. 5A and illustrate the piezoelectric substrate before and after an etching process, respectively.

Figure 2:
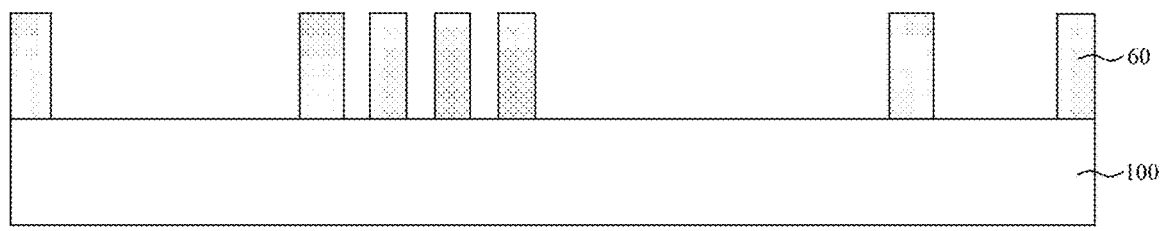
FIG. 2 to FIG. 13 illustrate schematic views of intermediate structures of various steps in a manufacturing method of a surface acoustic wave resonator device according to some embodiments of the present disclosure, among them, FIG. 2, FIG. 3, FIG. 4A, FIG. 5A, FIG. 6, FIG. 7, FIG. 8, FIG. 9, FIG. 10, FIG. 11, FIG. 12 and FIG. 13 respectively illustrate schematic cross-sectional views of the intermediate structures of various steps in the manufacturing method correspondingly taken along the line B-B' of FIG. 1A.

Referring to FIG. 2, a piezoelectric substrate 100 is provided, and the piezoelectric substrate 100 may include a suitable piezoelectric material such as a piezoelectric crystal, a piezoelectric ceramic, or the like. For example, a material of the piezoelectric substrate 100 may include aluminum nitride (AlN), doped aluminum nitride, zinc oxide (ZnO), lead zirconate titanate (PZT), lithium niobate (LiNbO$_3$), Quartz, potassium niobate (KNbO$_3$), lithium tantalate (LiTaO$_3$), the like or combinations thereof. In some embodiments, the piezoelectric substrate 100 may be a single-layered structure or a multi-layered structure, for example, it may be a composite structure of piezoelectric thin films, such as a composite structure of lithium tantalate piezoelectric thin film/silicon dioxide/silicon substrate. In some embodiments, the piezoelectric substrate 100 may be a monocrystalline piezoelectric substrate. However, the present disclosure is not limited thereto.

A mask layer 60 is formed on the piezoelectric substrate 100. The mask layer 60 may be or may include a patterned photoresist layer. For example, the mask layer 60 may be formed by coating or depositing a mask material layer (including a photoresist layer, for example) on the piezoelectric substrate 100, and then performing a photolithography process including exposure and development on the mask material layer to pattern the mask material layer and form the mask layer 60. In some embodiments, the mask layer 60 has a pattern corresponding to the subsequently formed interdigital transducer. For example, the mask layer 60 has a plurality of mask openings, and patterns of the plurality of mask openings are consistent with a pattern of the interdigital transducer.

Figure 3:
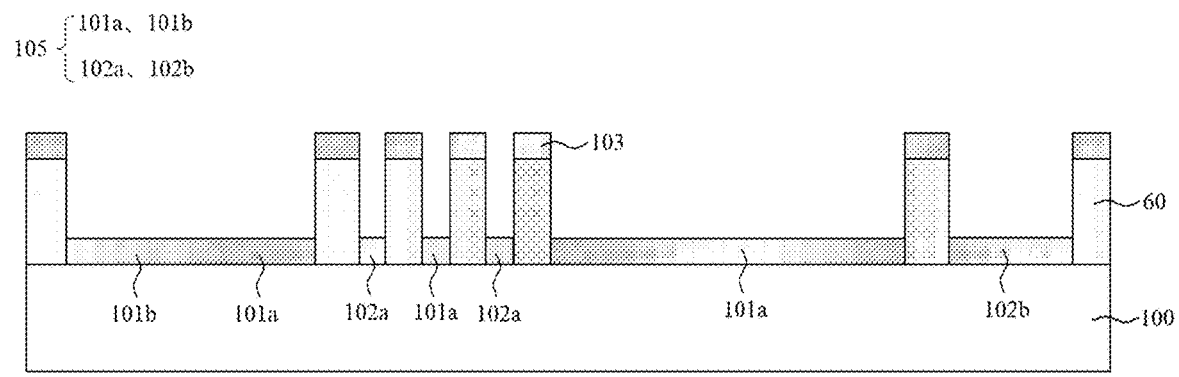

Referring to FIG. 3, an electrode material layer is formed on the piezoelectric substrate 100 and the mask layer 60. The electrode material layer is formed in the openings of the mask layer 60 and on a surface of the mask layer 60 at a side away from the piezoelectric substrate 100. The portion of the electrode material layer formed in the mask openings of the mask layer 60 constitutes the interdigital transducer 105; the portion of the electrode material layer formed on the surface of the mask layer 60 at the side away from the piezoelectric substrate 100 is a sacrificial portion 103 and will be removed in a subsequent process.

In some embodiments, the electrode material layer may include a metal material, for example, including one or more of the metal materials such as Ti, Cr, Ag, Cu, Mo, Pt, W, Al, etc. The electrode material layer may be a single-layered structure or a multi-layered structure, for example, it may be a stacked layer including combination of two or more of the above-mentioned metal materials. The electrode material layer may be formed by a deposition process such as evaporation, but the present disclosure is not limited thereto.

Figure 4A:
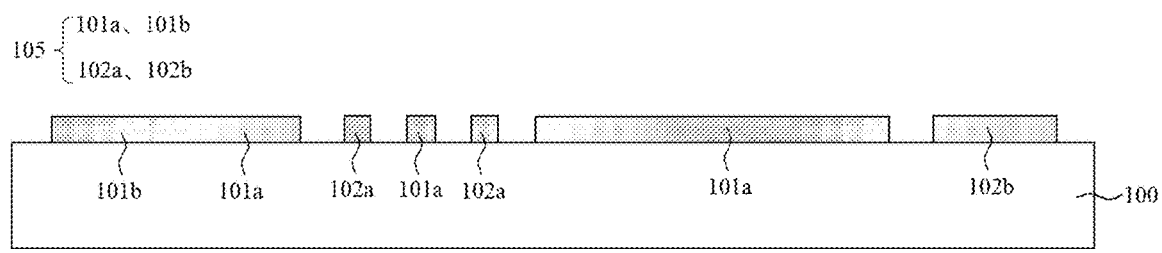
FIG. 4B and FIG. 5B are top views corresponding to FIG. 4A and FIG. 5A and illustrating a piezoelectric substrate before and after an etching process, respectively.

Referring to FIG. 3 and FIG. 4A, the mask layer 60 and the sacrificial portion 103 of the electrode material layer are removed, and the remaining electrode material layer constitutes an interdigital transducer 105 including a first interdigital electrode structure 101 and a second interdigital electrode structure 102. In some examples, the mask layer 60 includes a photoresist material, and the mask layer 60 and the sacrificial portion 103 of the electrode material layer overlying the mask layer 60 may be removed by a lift-off process.

In the embodiments illustrated in FIG. 3 to FIG. 4A, a photoresist lift-off process is adopted to pattern the electrode material layer to form the interdigital transducer 105, but the present disclosure is not limited thereto. In some other embodiments, The electrode material layer may also be patterned into an interdigital transducer by firstly forming an electrode material layer on an entire surface of the piezoelectric substrate 100, then forming a patterned mask layer on the electrode material layer, and then etching the electrode material layer using the patterned mask layer as an etching mask. Thereafter, the patterned mask layer is removed.

Figure 4B:
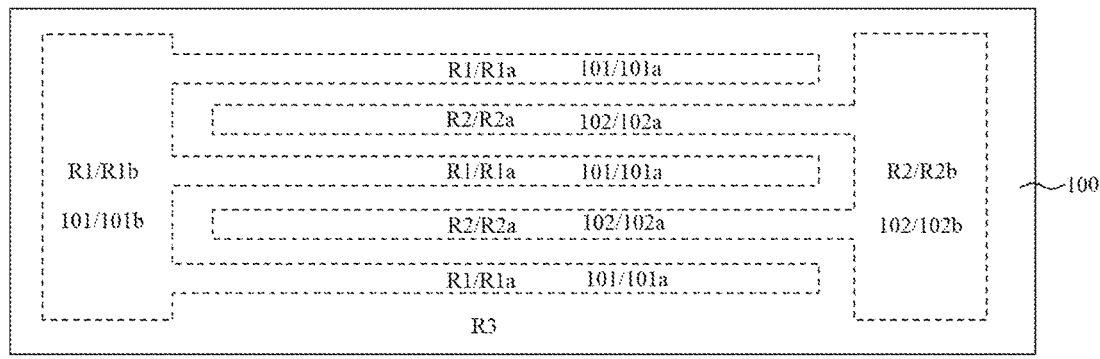

FIG. 4B illustrates a top view of the piezoelectric substrate 100 in a step corresponding to FIG. 4A. Referring to FIG. 4A and FIG. 4B, the piezoelectric substrate 100 includes a first piezoelectric region R1, a second piezoelectric region R2 and a third piezoelectric region R3. The first piezoelectric region R1 is a region of the piezoelectric substrate 100 in contact with the first electrode surface (i.e., the bottom surface illustrated in FIG. 4A) of the first interdigital electrode structure 101; the second piezoelectric region R2 is a region of the piezoelectric substrate 100 in contact with the second electrode surface (i.e., the bottom surface illustrated in FIG. 4A) of the second interdigital electrode structure 102; the third piezoelectric region R3 is the rest region of the piezoelectric substrate 100 other than the first piezoelectric region R1 and the second piezoelectric region R2, and a piezoelectric surface of the third piezoelectric region R3 is not in contact with the interdigital transducer 105, but is exposed by the interdigital transducer 105.

An orthographic projection of the first interdigital electrode structure 101 on the main surface of the piezoelectric substrate 100 coincides with the first piezoelectric region R1, and the orthographic projection of the first interdigital electrode structure 101 and the first piezoelectric region R1 have the same area. An orthographic projection of the second interdigital electrode structure 102 on the main surface of the piezoelectric substrate 100 coincides with the second piezoelectric region R2, and the orthographic projection of the second interdigital electrode structure 102 and the second piezoelectric region R2 have the same area. As illustrated in FIG. 4B, the first piezoelectric region R1 and the second piezoelectric region R2 indicated by the dotted boxes are also regions where orthographic projections of the first interdigital electrode structure 101 and the second interdigital electrode structure 102 on the piezoelectric substrate 100 are located, respectively. A part of an orthographic projection of the third piezoelectric region R3 on the main surface of the piezoelectric substrate 100 is located between the orthographic projections of the first interdigital electrode structure 101 and the second interdigital electrode structure 102 on the main surface of the piezoelectric substrate 100 in a direction parallel to the main surface of the piezoelectric substrate 100 (for example, a horizontal direction including the first direction D1 and the second direction D2).

For example, the first piezoelectric region R1 may include one or more first strip-shaped piezoelectric regions R1a and a first block-shaped piezoelectric region R1b; the first strip-shaped piezoelectric regions R1a are in one-to-one correspondence with the first interdigital electrodes 101a, and the first block-shaped piezoelectric region R1b is disposed in correspondence with the first interdigital electrode lead-out part 101b. For example, in the diagram illustrated in FIG. 4A, the first strip-shaped piezoelectric regions R1a and the first block-shaped piezoelectric region R1b are located directly below the first interdigital electrodes 101a and the first interdigital electrode lead-out part 101b, respectively. The second piezoelectric region R2 may include one or more second strip-shaped piezoelectric regions R2a and a second block-shaped piezoelectric region R2b; the second strip-shaped piezoelectric regions R2a are in one-to-one correspondence with the second interdigital electrodes 102a, and the second block-shaped piezoelectric region R2b is disposed in correspondence with the second interdigital electrode lead-out part 102b. For example, in the diagram illustrated in FIG. 4A, the second strip-shaped piezoelectric regions R2a and the second block-shaped piezoelectric region R2b are located directly below the second interdigital electrodes 102a and the second interdigital electrode lead-out part 102b, respectively.

FIG. 5A illustrates a schematic cross-sectional view of an intermediate structure after an etching process being performed on the piezoelectric substrate 100, and FIG. 5B illustrates a schematic top view of the piezoelectric substrate 100 after being etched. For clarity and convenience of illustration, portions of the piezoelectric substrate 100 that are etched are shown as being filled with patterns and delimited by dotted lines in FIG. 5A and FIG. 5B and subsequent drawings. It should be noted that, this is only for the convenience of illustrating different parts of the piezoelectric substrate 100, and it is not intended to limit that the respective parts of the piezoelectric substrate 100 adopt different materials or have interfaces between them. It should be understood that the piezoelectric substrate 100 may be a continuous substrate, and the respective piezoelectric parts of the piezoelectric substrate 100 may adopt the same material and be integrally formed, and there may be free of interface between the respective piezoelectric parts.

Referring to FIG. 4A, FIG. 4B, FIG. 5A and FIG. 5B, an etching process is performed on the piezoelectric substrate 100 to remove a portion of the piezoelectric substrate 100, and a recess 100r is formed in the piezoelectric substrate 100. In some embodiments, an etching process may be performed on the piezoelectric substrate 100 using the interdigital transducer 105 as an etching mask. For example, the etching process may be an anisotropic etching process, but the present disclosure is not limited thereto.

For example, the etching process removes a portion of the piezoelectric substrate 100 located in the third piezoelectric region R3, so that a thickness (i.e., a height) of this portion of the piezoelectric substrate 100 is reduced, thereby forming the recess 100r. Portions of the piezoelectric substrate located in the first piezoelectric region and the second piezoelectric region may substantially not be removed in the etching process. After the etching process, portions of the piezoelectric substrate 100 located in the first piezoelectric region R1, the second piezoelectric region R2 and the third piezoelectric region R3 form a first piezoelectric part 100a, a second piezoelectric part 100b and a third piezoelectric part 100c, respectively. The third piezoelectric part 100c is the remaining portion of the piezoelectric substrate 100 in the third piezoelectric region R3 after the etching process, and the first piezoelectric part 100a and the second piezoelectric part 100b substantially are not removed in the etching process. The first piezoelectric part 100a and the second piezoelectric part 100b may have substantially the same first height H1, and the first height H1 is greater than a second height H2 of the third piezoelectric part 100c. The recess 100r is defined by a sidewall of the first piezoelectric part 100a, a sidewall of the second piezoelectric part 100b and a main surface (i.e., the top surface illustrated in the figure) of the third piezoelectric part 100c.

In an alternative embodiment, the etching process may also be an isotropic etching process, so that portions of the piezoelectric substrate located in the first piezoelectric region and the second piezoelectric region and close to an edge of the interdigital transducer may be removed by the etching process, and an undercut region (not illustrated) may be formed between the interdigital transducer and the piezoelectric substrate.

Figure 6:
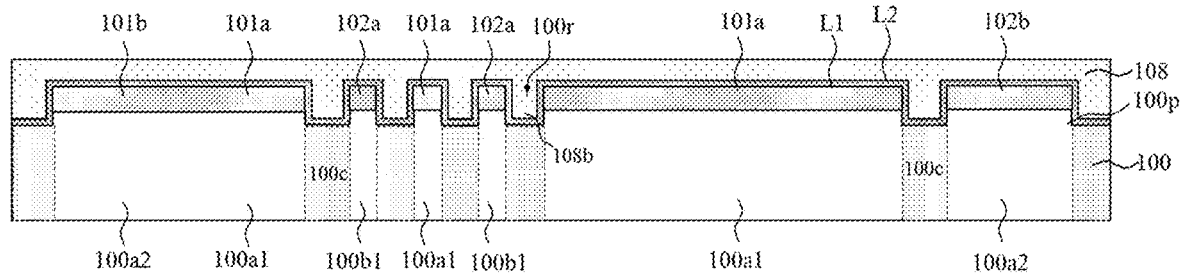

Referring to FIG. 5A and FIG. 6, a first temperature compensation layer 108 is formed on the piezoelectric substrate 100 and on the interdigital transducer 105 to cover a surface of the piezoelectric substrate 100 exposed by the interdigital transducer 105, as well as sidewalls of the interdigital transducer 105 and a surface of the interdigital transducer 105 at a side away from the piezoelectric substrate 100. The first temperature compensation layer 108 may include one or more dielectric materials and/or semiconductor materials, for example, it may include one or more of silicon oxide ($SiO_2$), silicon nitride (SiN), aluminum nitride (AlN), amorphous silicon, gallium nitride, and the like. The first temperature compensation layer 108 may be a single-layered structure or a multi-layered structure. For example, the first temperature compensation layer 108 may be a single-layered structure, and may include a silicon oxide material. Alternatively, the first temperature compensation layer 108 may be a multi-layered structure, and may include a stacked layer of a silicon oxide layer and a non-silicon-oxide layer formed of a material such as silicon nitride (SiN), aluminum nitride (AlN), amorphous silicon, gallium nitride, or the like. Among them, the non-silicon-oxide layer is at least disposed between the silicon oxide layer and the interdigital transducer; a thickness of the silicon oxide layer may be greater than that of the non-silicon-oxide layer; the silicon oxide layer is mainly used to realize temperature compensation, and the non-silicon-oxide layer is used as a protective layer to protect the interdigital transducer against oxidization in the subsequent process.

For example, one or more material layers of the first temperature compensation layer may be formed by a deposition process such as CVD or PVD, and then the material layer may be subjected to a planarization process (for example, a chemical mechanical polishing (CMP) process) to form the first temperature compensation layer 108 with a substantially flat surface.

In some embodiments, the first temperature compensation layer 108 has a multi-layered structure, and may include a first temperature compensation sub-layer and a second temperature compensation sub-layer. The first temperature compensation sub-layer may be located at least in the body part, cover a sidewall of the interdigital transducer and a surface of the interdigital transducer at a side away from the piezoelectric substrate, and separate the interdigital transducer from the second temperature compensation sub-layer. In some embodiments, the first temperature compensation sub-layer may further extend to cover a part of a surface of the piezoelectric substrate and separate the second temperature compensation sub-layer from the piezoelectric substrate, but the present disclosure is not limited thereto. For example, forming the first temperature compensation layer may include forming a first temperature compensation sub-layer to cover at least a sidewall of the interdigital transducer and a surface of the interdigital transducer at a side away from the piezoelectric substrate; and forming a second temperature compensation sub-layer on the piezoelectric substrate and on the first temperature compensation sub-layer.

For example, the first temperature compensation layer 108 includes a first temperature compensation sub-layer L1 and a second temperature compensation sub-layer L2. The first temperature compensation sub-layer L1 may be a thin layer extending along a surface of the interdigital transducer 105 and a surface of the piezoelectric substrate 100 exposed by the interdigital transducer 105, and the second temperature compensation sub-layer L2 is located on a side of the first temperature compensation sub-layer L1 away from the piezoelectric substrate 100 and the interdigital transducer 105. The interdigital transducer 105 and the second temperature compensation sub-layer L2 may be spaced apart from each other by the first temperature compensation sub-layer L1 located therebetween. A material of the first temperature compensation sub-layer L1 is different from a material of the second temperature compensation sub-layer L2, a temperature compensation performance of the second temperature compensation sub-layer L2 can be greater than a temperature compensation performance of the first temperature compensation sub-layer L1, and a thickness of the second temperature compensation sub-layer L2 can be much greater than a thickness of the first temperature compensation sub-layer L1, thereby ensuring the temperature compensation performance of the temperature compensation layer and improving the temperature coefficient of frequency of the resonator device.

For example, the first temperature compensation sub-layer L1 may be a conformal layer and conform to surface contours of the piezoelectric substrate 100 and the interdigital transducer 105, but the present disclosure is not limited thereto. In some embodiments, the second temperature compensation sub-layer L2 may include an oxide material such as silicon oxide; the first temperature compensation sub-layer L1 may be a non-silicon-oxide layer, and may include one or more of dielectric materials such as silicon nitride (SiN), aluminum nitride (AlN) and the like and semiconductor materials such as amorphous silicon, gallium nitride (GaN) and the like; and the first temperature compensation sub-layer L1 may not include an oxide material. For example, the first temperature compensation sub-layer L1 can be used as a protective layer to protect the interdigital transducer 105 from being oxidized. For example, the first temperature compensation sub-layer L1 can protect the interdigital transducer 105 against oxidation during the formation of the second temperature compensation sub-layer L2.

For instance, in an example, the second temperature compensation sub-layer L2 may be or may include a silicon oxide layer, and is deposited by a PVD process, in which a silicon target is used as a sputtering target and an appropriate amount of oxygen ($O_2$) is introduced into a deposition chamber to deposit and form the silicon oxide layer. In this embodiment, since the first temperature compensation sub-layer L1 is formed before forming the second temperature compensation sub-layer L2, and the first temperature compensation sub-layer L1 completely covers a sidewall of the interdigital transducer 105 and a surface of the interdigital transducer 105 at a side away from the piezoelectric substrate 100, in the process of forming the second temperature compensation sub-layer L2 (for example, a silicon oxide layer), the first temperature compensation sub-layer L1 isolates the metal material of the interdigital transducer 105 from oxygen in the deposition chamber to prevent the interdigital transducer 105 from being oxidized in the process of forming the first temperature compensation layer 108, thereby further avoiding issues such as degradation of device performance caused by the oxidation of the interdigital transducer 105.

In some embodiments, the first temperature compensation sub-layer L1 not only covers a surface of the interdigital transducer 105, but also fills in the recess 100r of the piezoelectric substrate 100 and covers a surface of the recess 100r, that is, covering sidewalls of the first piezoelectric part 100a and the second piezoelectric part 100b and a main surface of the third piezoelectric part 100c. In this way, all the surfaces of the piezoelectric substrate 100 exposed by the interdigital transducer 105 are spaced apart from the second temperature compensation sub-layer L2 by the first temperature compensation sub-layer L1. However, the present disclosure is not limited thereto.

The first temperature compensation sub-layer L1 may be optionally formed according to product requirements, and in some other embodiments, the first temperature compensation sub-layer L1 may be omitted. That is, the first temperature compensation layer 108 may have a single-layered structure and may include only the second temperature compensation sub-layer L2 such as a silicon oxide layer.

In an alternative embodiment where an undercut region is formed between the interdigital transducer and the piezoelectric substrate, the protruding part of the first temperature compensation layer may also be filled into the undercut region, thereby further increasing a contact area between the protruding part and the piezoelectric substrate; and a portion of the protruding part located in the undercut region may be in contact with a bottom surface of an edge portion of the interdigital transducer. However, it should be understood that even if the protruding part is in contact with the bottom surface of the edge portion of the interdigital transducer, each of the first piezoelectric part and the second piezoelectric part of the piezoelectric substrate that are in direct contact with the interdigital transducer is continuous, so as to ensure the reliability, stability and other performances of acoustic-electric conversion of the interdigital transducer.

Referring to FIG. 6, the first temperature compensation layer 108 extends into the recess 100r of the piezoelectric substrate 100, and a portion of the first temperature compensation layer 108 filled in the recess 100r constitutes the protruding part 108b of the first temperature compensation layer 108, and the protruding part 108b is located on a side of the third piezoelectric part 100c in a third direction perpendicular to the main surface of the piezoelectric substrate and is surrounded by the first piezoelectric part 100a and the second piezoelectric part 100b in a direction parallel to the main surface of the piezoelectric substrate (for example, a horizontal direction including the first direction D1 and the second direction D2).

In some embodiments, the protruding part 108b of the first temperature compensation layer 108 may include a part of the first temperature compensation sub-layer L1 and may also include a part of the second temperature compensation sub-layer L2, and the piezoelectric substrate is spaced apart from the second temperature compensation sub-layer L2 by the part of the first temperature compensation sub-layer L1. However, the present disclosure is not limited thereto.

Figure 7:
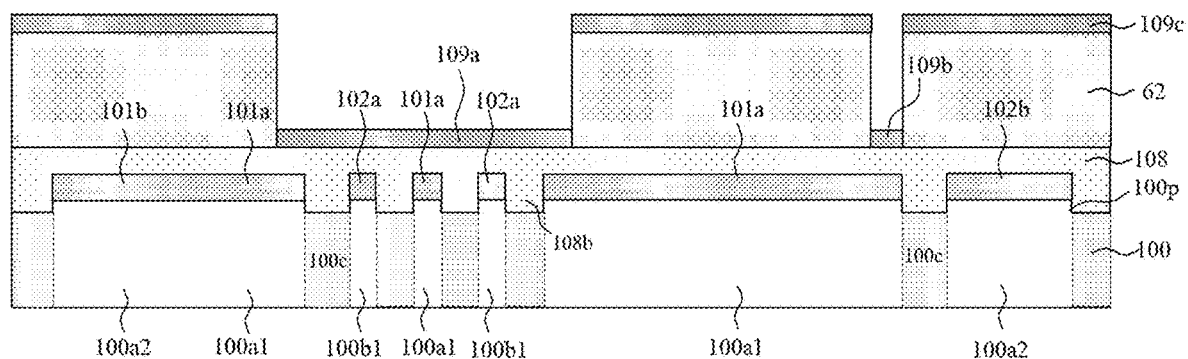

Referring to FIG. 7, a mask layer 62 is formed on a side of the first temperature compensation layer 108 away from the piezoelectric substrate 100. The mask layer 62 may be a patterned photoresist layer, and has a pattern corresponding to the clutter suppression structure 109 formed subsequently. For example, the mask layer 62 has a plurality of openings to expose portions of a surface of the first temperature compensation layer 108 away from the piezoelectric substrate 100, and a pattern of the plurality of openings is consistent with the pattern of the clutter suppression structure 109. For simplicity of illustration, the first temperature compensation layer 108 is illustrated as a single layer in FIG. 7 and in subsequent drawings, but it should be understood that the first temperature compensation layer 108 may be a single-layered structure, or may also be a multi-layer structure as illustrated in FIG. 6.

For example, a metal material layer is formed on the first temperature compensation layer 108 and the mask layer 62, and the metal material layer is filled in the openings of the mask layer 62 and covers a surface of the mask layer 62 at a side away from the first temperature compensation layer 108. For example, the metal material layer includes a portion formed in the opening of the mask layer 62 and served as a first clutter suppression layer 109a, a portion formed in the opening of the mask layer 62 and served as a second clutter suppression layer 109b, and a sacrificial portion 109c formed at a side of the mask layer 62 away from the first temperature compensation layer 108. For example, the metal material layer may include a metal material such as gold, tungsten, silver, titanium, platinum, aluminum, copper, molybdenum, the like, alloys thereof, or combinations thereof, and may be formed by a deposition process such as evaporation.

Figure 8:
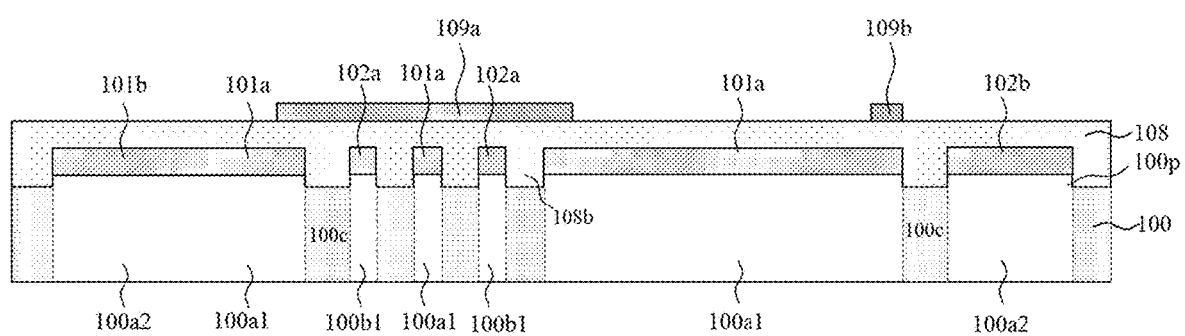

Referring to FIG. 7 and FIG. 8, the mask layer 62 and the sacrificial portion 109c of the metal material layer on the mask layer 62 are removed, and the remaining metal material constitutes a clutter suppression structure 109 including a first clutter suppression layer 109a and a second clutter suppression layer 109b. For example, the mask layer 62 and the sacrificial portion 109c may be removed by a lift-off process.

In this example, the patterning of the metal material layer is realized by a photoresist lift-off process, but the present disclosure is not limited thereto. In an alternative embodiment, the patterning of the conductive material layer may also be realized by firstly forming a metal material layer on an entire surface of the first temperature compensation layer 108, then forming a patterned photoresist layer on the metal material layer, and then etching the metal material layer by using the patterned photoresist layer as an etching mask.

Figure 9:
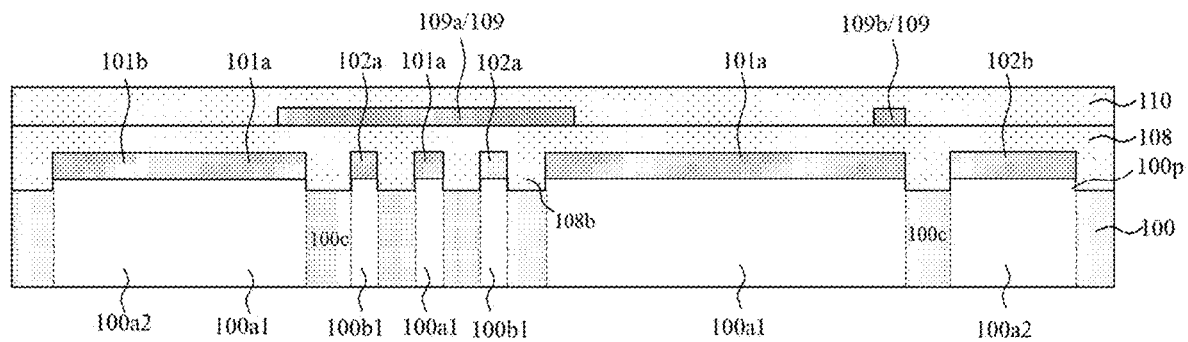

Referring to FIG. 9, a second temperature compensation layer 110 is formed on a side of the first temperature compensation layer 108 away from the piezoelectric substrate 100 to cover sidewalls of the clutter suppression structure 109 and a surface of the clutter suppression structure 109 at a side away from the piezoelectric substrate 100. A material of the second temperature compensation layer 110 may be the same as or different from a material of the first temperature compensation layer 108. For example, the second temperature compensation layer 110 may include one or more dielectric materials and/or semiconductor materials, including, for example, silicon oxide ($SiO_2$), silicon nitride (SiN), aluminum nitride (AlN), amorphous silicon, gallium nitride (GaN) or combinations thereof. For example, a temperature compensation material layer may be formed by a deposition process such as CVD or PVD, and then a planarization process (for example, a chemical mechanical polishing (CMP) process) may be performed on the temperature compensation material layer to form the second temperature compensation layer 110 with a substantially flat surface.

In some embodiments, the second temperature compensation layer 110 is a single-layered structure, and may include silicon oxide. In an alternative embodiment, similar to the first temperature compensation layer illustrated in FIG. 6, the second temperature compensation layer 110 may also have a multi-layered structure and may include a third temperature compensation sub-layer and a fourth temperature compensation sub-layer (not illustrated). The third temperature compensation sub-layer is located on the first temperature compensation layer 108, and may at least cover sidewalls of the clutter suppression structure 109 and a surface of the clutter suppression structure 109 at a side away from the piezoelectric substrate, and in some examples may further cover a surface of the first temperature compensation layer 108 at a side away from the piezoelectric substrate 100. The fourth temperature compensation sub-layer is located on the third temperature compensation sub-layer, for example, at a side of the third temperature compensation sub-layer away from the piezoelectric substrate. A material of the third temperature compensation sub-layer is different from a material of the fourth temperature compensation sub-layer; and the clutter suppression structure 109 and the fourth temperature compensation sub-layer are spaced apart from each other by the third temperature compensation sub-layer located therebetween. The first temperature compensation layer 108 may be in direct contact with the fourth temperature compensation sub-layer, or may be spaced apart from the fourth temperature compensation sub-layer by the third temperature compensation sub-layer located therebetween.

For example, the fourth temperature compensation sub-layer may include an oxide material such as silicon oxide. The third temperature compensation sub-layer may include a non-silicon oxide material such as silicon nitride (SiN), aluminum nitride (AlN), amorphous silicon, gallium nitride (GaN), or the like, for example, the third temperature compensation sub-layer may not include an oxide material. The third temperature compensation sub-layer can be used as a protective layer to protect the metal material of the clutter suppression structure against oxidation, for example, the metal material can be protected against oxidation in the process of forming the fourth temperature compensation sub-layer (e.g., a silicon oxide layer), thus avoiding issues such as degradation of clutter suppression performance caused by the oxidation of the metal material. It should be understood that the third temperature compensation sub-layer may be optionally formed according to product requirements, and can be omitted in some embodiments. For example, the second temperature compensation layer 110 may be a single-layered structure of a silicon oxide layer.

Referring to FIG. 9, the first temperature compensation layer 108 and the second temperature compensation layer 110 together constitute a temperature compensation structure, and the clutter suppression structure 109 is embedded in the temperature compensation structure. In some embodiments, forming the second temperature compensation layer 110 can improve an overall thickness of the temperature compensation structure, thereby further improving the temperature coefficient of frequency of the resonator device and the filter.

Figure 10:
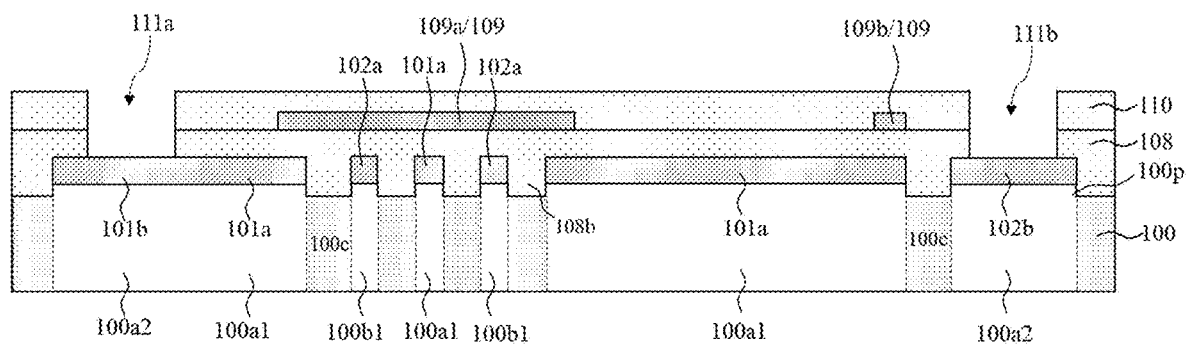

Referring to FIG. 9 and FIG. 10, a patterning process is performed on the temperature compensation structure to form an opening 111a and an opening 111b in the temperature compensation structure. The patterning process may include photolithography and etching processes. Referring to FIG. 10, the opening 111a and the opening 111b respectively extend through the temperature compensation structure (e.g., the second temperature compensation layer 110 and the first temperature compensation layer 108) to expose a portion of a surface of the first interdigital electrode lead-out part 101b and a portion of a surface of the second interdigital electrode lead-out part 102b at a side away from the piezoelectric substrate 100.

Figure 11:
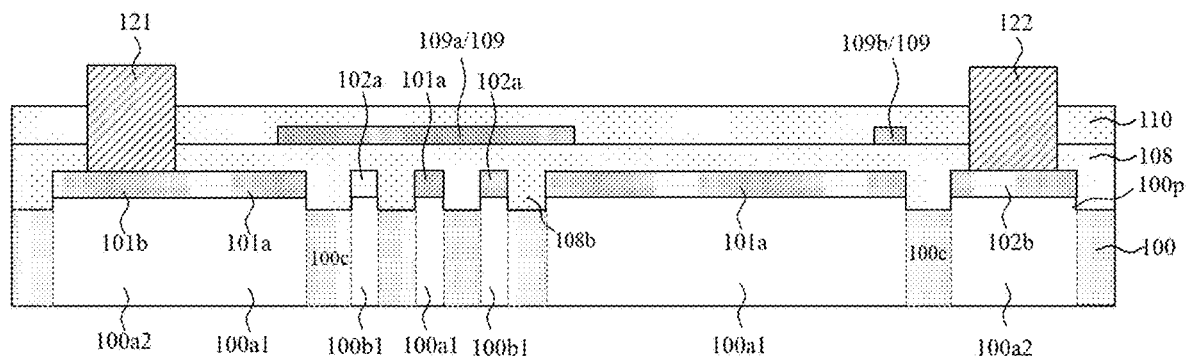

Referring to FIG. 10 and FIG. 11, a first conductive connector 121 and a second conductive connector 122 are formed on a portion of the first interdigital electrode lead-out part 101b exposed by the opening 111a and a portion of the second interdigital electrode lead-out part 102b exposed by the opening 111b, respectively. The first conductive connector 121 and the second conductive connector 122 are electrically connected to the first interdigital electrode lead-out part 101b and the second interdigital electrode lead-out part 102b, respectively. The first conductive connector 121 may be electrically connected to a plurality of first interdigital electrodes 101*a* through the first interdigital electrode lead-out part 101*b*, and the second conductive connector 122 may be electrically connected to a plurality of second interdigital electrodes 102*a* through the second interdigital electrode lead-out part 102*b*.

Materials of the first conductive connector 121 and the second conductive connector 122 may include metal materials such as Ti, Cr, Al, Cu, Ni, Ag, Au or a stacked layer including combination of the above-mentioned materials. The material of the conductive connector may be the same as or different from that of the interdigital transducer. In some embodiments, a method of forming the first conductive connector 121 and the second conductive connector 122 may include a deposition process such as PVD and a patterning process (e.g., a lift-off process).

Figure 12:
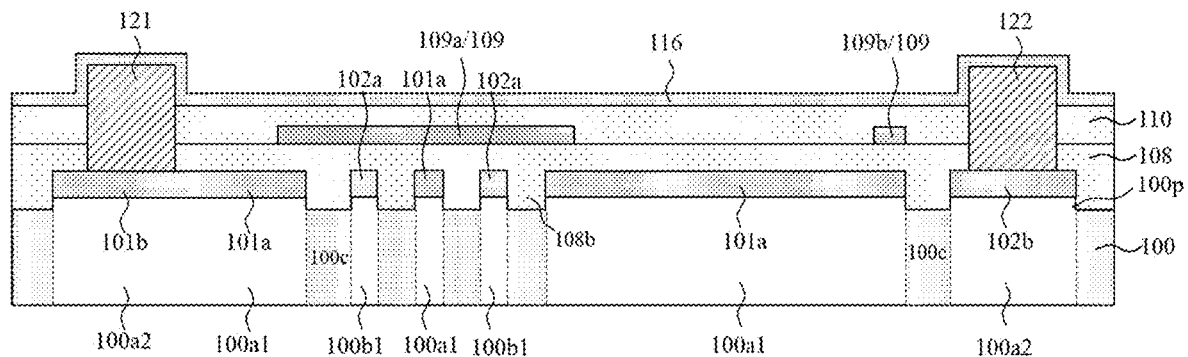

Referring to FIG. 12, a passivation layer 116 is then formed on the temperature compensation structure and the conductive connectors to cover a surface of the temperature compensation structure (for example, the second temperature compensation layer 110) at a side away from the piezoelectric substrate 100, as well as sidewalls of portions of the first and second conductive connectors 121 and 122 protruded from the temperature compensation structure and surfaces of these portions at a side away from the piezoelectric substrate 100. In some embodiments, a material of the passivation layer 116 may include an insulating material such as silicon nitride, aluminum nitride, amorphous silicon, gallium nitride, the like or combinations thereof. The passivation layer 116 may protect conductive connectors, and may serve as a frequency adjustment layer.

Figure 13:
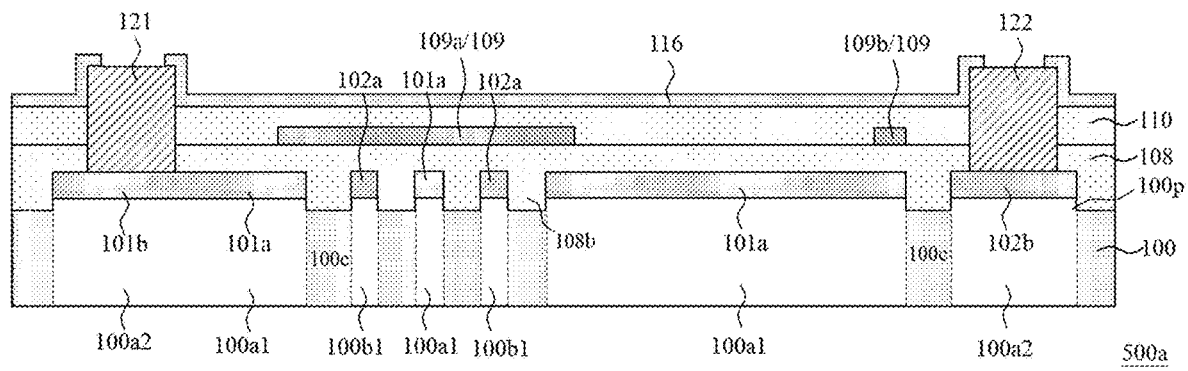

Referring to FIG. 12 and FIG. 13, in some embodiments, a patterning process is performed on the passivation layer 116 to remove portions of the passivation layer 116 and to form a plurality of openings in the passivation layer 116. The plurality of openings respectively expose a portion of a surface of the first conductive connector 121 and a portion of a surface of the second conductive connector 122 at a side away from the piezoelectric substrate, so as to be used for external connections.

In the above-described embodiment, in the examples where the first temperature compensation structure is a multi-layered structure, the piezoelectric substrate is spaced apart from the second temperature compensation sub-layer by the first temperature compensation sub-layer, but the present disclosure is not limited thereto. In some other embodiments, after forming the first temperature compensation sub-layer L1, a portion of the first temperature compensation sub-layer L1 that is in contact with the piezoelectric substrate 100 may also be removed, and an opening may be formed in the first temperature compensation sub-layer L1, so that the subsequently formed second temperature compensation sub-layer L2 can extend through the opening to be in contact with the piezoelectric substrate, for example, to be at least in contact with a main surface of the third piezoelectric part 100*c* of the piezoelectric substrate 100.

Figure 14:
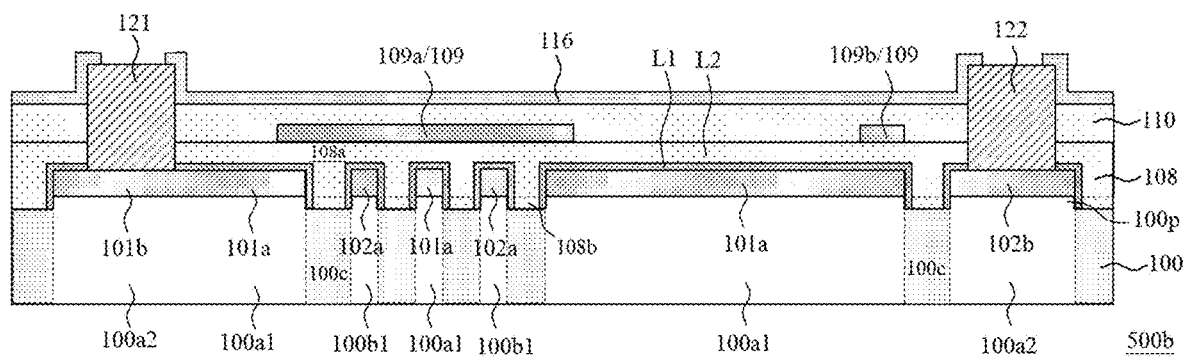
FIG. 14 illustrates a schematic cross-sectional view of a surface acoustic wave resonator device according to some other embodiments of the present disclosure.

For example, FIG. 14 illustrates a schematic cross-sectional view of a surface acoustic wave resonator device 500*b* according to some other embodiments of the present disclosure. The surface acoustic wave resonator device of this embodiment is similar to that of the previous embodiment, and the difference lies in that, in the surface acoustic wave resonator device 500*b*, the first temperature compensation sub-layer of the first temperature compensation layer 108 has an opening, so that the second temperature compensation sub-layer is in direct contact with the third piezoelectric part 100*c*.

Referring to FIG. 14, in some embodiments, the first temperature compensation layer 108 includes a first temperature compensation sub-layer L1 and a second temperature compensation sub-layer L2; the first temperature compensation sub-layer L1 covers (e.g., completely covers) sidewalls of the interdigital transducer 105 and a surface of the interdigital transducer 105 at a side away from the piezoelectric substrate 100, and may cover sidewalls of the piezoelectric protrusions 100*p* of the first piezoelectric part 100*a* and the second piezoelectric part 100*b*. The first temperature compensation sub-layer L1 has an opening to expose at least part of a main surface of the third piezoelectric part 100*c*. The second temperature compensation sub-layer L2 passes through the opening of the first temperature compensation sub-layer L1, and is in contact with the at least part of the main surface of the third piezoelectric part 100*c* that is exposed.

In this example, the sidewalls of the piezoelectric protrusions 100*p* of the first piezoelectric part 100*a* and the second piezoelectric part 100*b* are substantially aligned with the sidewalls of the interdigital transducer in a third direction perpendicular to the main surface of the piezoelectric substrate, and a portion of the first temperature compensation sub-layer L1 covering the sidewall of the piezoelectric protrusion 100*p* also covers an edge portion of the main surface of the third piezoelectric part 100*c*.

The protruding part 108*b* of the first temperature compensation layer 108 includes a portion of the first temperature compensation sub-layer L1 and a portion of the second temperature compensation sub-layer L2 located in the recess of the piezoelectric substrate. The portion of the first temperature compensation layer L1 covers a sidewall of the first piezoelectric part 100*a* and a sidewall of the second piezoelectric part 100*b*, for example, covering sidewalls of the piezoelectric protrusions 100*p*. The portion of the second temperature compensation sub-layer L2 is in direct contact with the third piezoelectric part 100*c* of the piezoelectric substrate 100.

In some embodiments, the manufacturing method of the surface acoustic wave resonator device 500*b* is similar to that of the surface acoustic wave resonator device 500*a*, and the difference lies in that, in the step illustrated in FIG. 6, after forming the first temperature compensation sub-layer L1 on the piezoelectric substrate and the interdigital transducer, and before forming the second temperature compensation sub-layer L2, the method further includes removing a portion of the first temperature compensation sub-layer L1 covering the third piezoelectric part 100*c*, so as to expose at least part of the main surface of the third piezoelectric part 100*c*, so that the subsequently formed second temperature compensation sub-layer L2 is in contact with the third piezoelectric part 100*c*.

For example, removing a portion of the first temperature compensation sub-layer L1 may include the following processes: a mask layer (not illustrated) is formed over the piezoelectric substrate 100, in which the mask layer may be or may include a patterned photoresist layer. The mask layer is located above the first piezoelectric region, the second piezoelectric region and part of the third piezoelectric region, so that a portion of the first temperature compensation sub-layer L1 covering the interdigital transducer is covered by the mask layer, and a portion of the first temperature compensation sub-layer L1 covering the third piezoelectric part 100*c* is exposed by the mask layer. Thereafter, an etching process is performed on the first temperature compensation sub-layer L1 using the mask layer as an etching mask, so as to remove the portion of the first temperature compensation sub-layer L1 exposed by the mask layer, thereby forming an opening in the first temperature compensation sub-layer L1. The opening exposes a portion of the piezoelectric substrate located in the third piezoelectric region, for example, exposes part of a main surface of the third piezoelectric part 100c. Other process steps and structural features of the manufacturing method of the surface acoustic wave resonator device 500b are substantially the same as those of the surface acoustic wave resonator device 500a, which are not described again here.

In some embodiments, the temperature compensation performance of the second temperature compensation sub-layer L2 is superior to the temperature compensation performance of the first temperature compensation sub-layer L1. In this example, sidewalls of the interdigital transducer 105 and a surface of the interdigital transducer 105 at a side away from the piezoelectric substrate are covered (e.g., completely covered) by the first temperature compensation sub-layer L1. Moreover, the second temperature compensation sub-layer L2, which mainly serves for temperature compensation, passes through the opening of the first temperature compensation sub-layer to be in direct contact with the piezoelectric substrate. Therefore, compared with the temperature compensation structure in the surface acoustic wave resonator device illustrated in FIG. 6, the temperature compensation structure in this example can further improve the temperature compensation performance of the resonator device while protecting the interdigital transducer against oxidation, thus further improving the temperature coefficient of frequency of the resonator device and the filter.

In still some other embodiments, the first temperature compensation sub-layer has an opening so that the second temperature compensation sub-layer passes through the opening to be in contact with the piezoelectric substrate. Furthermore, the protruding part of the first temperature compensation layer may only include the second temperature compensation sub-layer but not include the first temperature compensation sub-layer. For example, the protruding part of the first temperature compensation layer includes a portion of the second temperature compensation sub-layer, and the portion of the second temperature compensation sub-layer is located on the third piezoelectric part of the piezoelectric substrate and is in contact with sidewalls of the first piezoelectric part and the second piezoelectric part.

Figure 15:
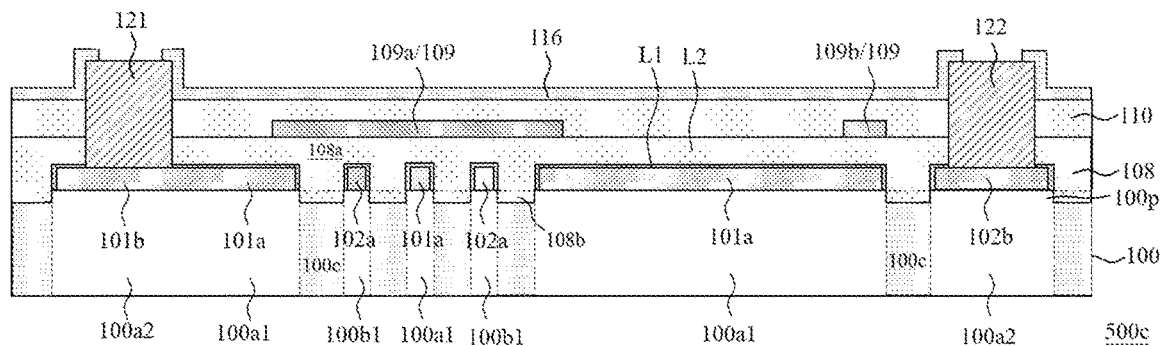
FIG. 15 illustrates a schematic cross-sectional view of a surface acoustic wave resonator device according to further some other embodiments of the present disclosure.

For example, FIG. 15 illustrates a schematic cross-sectional view of a surface acoustic wave resonator device 500c according to further some other embodiments of the present disclosure. The surface acoustic wave resonator device 500c is similar to that of the previous embodiment, and the difference lies in that, in the surface acoustic wave resonator device 500c, the first temperature compensation sub-layer is located in the body part of the first temperature compensation layer, but not in the protruding part of the first temperature compensation layer. The differences of the surface acoustic wave resonator device 500c will be described in details below, and other structural features that are the same as those of the previous embodiment will not be repeated here.

Referring to FIG. 15, in some embodiments, in the surface acoustic wave resonator device 500c, the first temperature compensation layer 108 includes a first temperature compensation sub-layer L1 and a second temperature compensation sub-layer L2. The first temperature compensation sub-layer L1 covers (for example, completely covers) sidewalls of the interdigital transducer 105 and a surface of the interdigital transducer 105 at a side away from the piezoelectric substrate. The second temperature compensation sub-layer L2 is located on the first temperature compensation sub-layer L1 and filled in the recess of the piezoelectric substrate 100. The first temperature compensation sub-layer L1 may be located on the topmost surface of the piezoelectric substrate without covering a sidewall of the first piezoelectric part or a sidewall of the second piezoelectric part, and without covering the third piezoelectric part. The interdigital transducer 105 and the second temperature compensation sub-layer L2 are spaced apart from each other by the first temperature compensation sub-layer L1 located therebetween, so that the first temperature compensation sub-layer L1 can protect the interdigital transducer against oxidation, for example, in the process of forming the second temperature compensation sub-layer L2.

The second temperature compensation sub-layer L2 is in direct contact with the piezoelectric substrate 100, for example, the second temperature compensation sub-layer L2 may be in direct contact with sidewalls of the piezoelectric protrusions 100p of the first piezoelectric part 100a and the second piezoelectric part 100b as well as a main surface of the third piezoelectric part 100c. In this example, the body part 108a of the first temperature compensation layer 108 includes a portion of the first temperature compensation sub-layer L1 and a portion of the second temperature compensation sub-layer L2, while the protruding part 108b includes only a portion of the second temperature compensation sub-layer L2 located in the recess of the piezoelectric substrate and may not include the first temperature compensation sub-layer L1.

In some embodiments, sidewalls of the piezoelectric protrusions 100p of the first piezoelectric part 100a and the second piezoelectric part 100b may be substantially aligned with outer sidewalls of the first temperature compensation sub-layer L1 in a third direction perpendicular to the main surface of the piezoelectric substrate. The outer sidewall of the first temperature compensation sub-layer L1 refers to a sidewall opposite to an inner sidewall of the first temperature compensation sub-layer L1 in a direction parallel to the main surface of the piezoelectric substrate, wherein the inner sidewall is in contact with the interdigital transducer.

In this example, the first temperature compensation sub-layer L1 covers the interdigital transducer without extending into the recess of the piezoelectric substrate or covering the sidewalls of the first piezoelectric part or the second piezoelectric part; and the second temperature compensation sub-layer L2 is filled in the recess of the piezoelectric substrate to be in contact with the sidewalls of the piezoelectric protrusions and the main surface of the third piezoelectric part. Compared with the surface acoustic wave resonator device 500b illustrated in FIG. 14, in the surface acoustic wave resonator device of this embodiment, a contact area between the second temperature compensation sub-layer L2 and the piezoelectric substrate 100 is further increased (for example, maximized). Since the temperature compensation performance of the second temperature compensation sub-layer L2 is superior to the temperature compensation performance of the first temperature compensation sub-layer L1, this embodiment can further improve the temperature compensation performance of the resonator device while protecting the interdigital transducer against oxidation, thereby further improving the temperature coefficient of frequency of the resonator device.

In the manufacturing methods of the surface acoustic wave resonator devices 500a and 500b in the foregoing embodiments, both the first temperature compensation sub-layer L1 and the second temperature compensation sub-layer L2 of the first temperature compensation layer 108 are formed after performing an etching process on the piezoelectric substrate to form the recess, but the present disclosure is not limited thereto. For example, in a manufacturing method of the surface acoustic wave resonator device 500c, the first temperature compensation sub-layer L1 may be formed before performing the etching process on the piezoelectric substrate, and the second temperature compensation sub-layer L2 may be formed after the etching process is performed to the piezoelectric substrate.

Figure 16A:
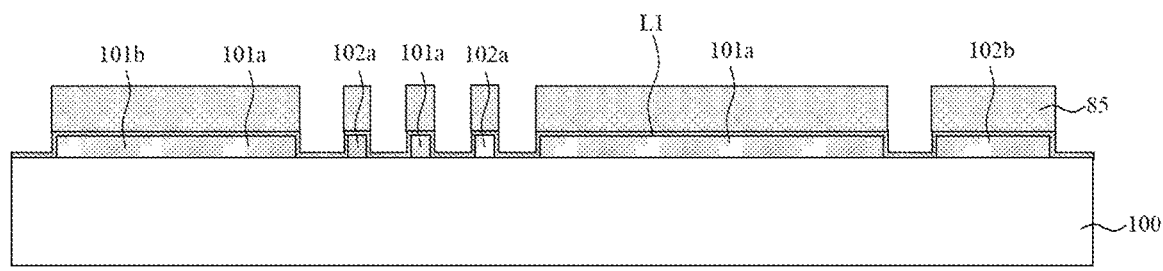
FIG. 16A to FIG. 16C illustrate schematic cross-sectional views of intermediate structures of various steps in a manufacturing method of a surface acoustic wave resonator device according to still some other embodiments of the present disclosure.
Figure 16B:
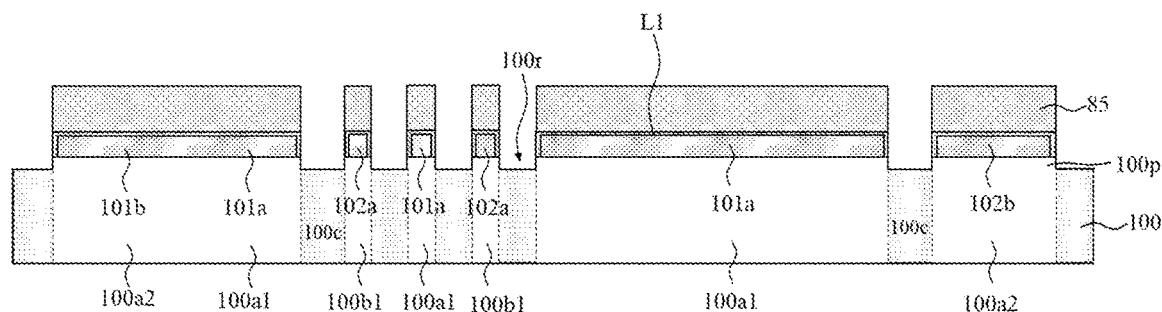
Figure 16C:
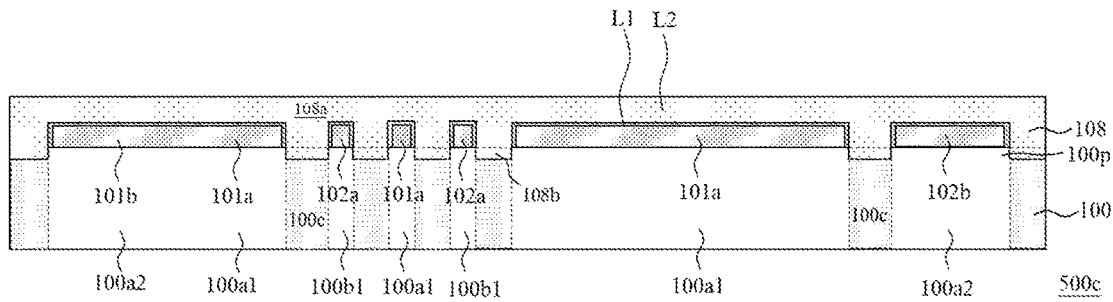

FIG. 16A to FIG. 16C illustrate schematic cross-sectional views of intermediate structures of various steps in a manufacturing method of a surface acoustic wave resonator device 500c according to some embodiments of the present disclosure.

Referring to FIG. 16A, processes the same as those described in FIG. 2 to FIG. 4A are performed to form an interdigital transducer 105 including a first interdigital electrode structure 101 and a second interdigital electrode structure 102 on a piezoelectric substrate 100. Thereafter, a first temperature compensation sub-layer L1 is formed on the piezoelectric substrate 100 and the interdigital transducer 105. In this step, the first temperature compensation sub-layer L1 continuously extends along sidewalls of the interdigital transducer 105 and a surface of the interdigital transducer 105 at a side away from the piezoelectric substrate, as well as a surface of the piezoelectric substrate 100 exposed by the interdigital transducer 105.

A mask layer 85 is formed over the piezoelectric substrate 100 to cover a portion of the first temperature compensation sub-layer L1 which covers the interdigital transducer 105. The mask layer 85 has a mask opening to expose a portion of the first temperature compensation sub-layer L1 which is in contact with the piezoelectric substrate 100. For example, a portion of the first temperature compensation sub-layer L1 covering sidewalls of the interdigital transducer 105 and a surface of the interdigital transducer 105 at a side away from the piezoelectric substrate are covered by the mask layer 85, while a portion of the first temperature compensation sub-layer L1 that is in contact with the piezoelectric substrate and extends in a direction (for example, a horizontal direction) parallel to the main surface of the piezoelectric substrate is exposed by the mask opening of the mask layer 85. In FIG. 16A, the portion of the first temperature compensation sub-layer L1 exposed by the mask opening is a horizontally extending portion thereof which is in contact with the piezoelectric substrate 100 as illustrated in the figure.

Referring to FIG. 16A and FIG. 16B, an etching process is performed on the first temperature compensation sub-layer L1 and the piezoelectric substrate 100 using the mask layer 85 as an etching mask, so as to remove the portion of the first temperature compensation sub-layer L1 exposed by the mask opening, and then etch a portion of the piezoelectric substrate 100, so that a recess 100r is formed in the piezoelectric substrate 100.

Referring to FIG. 16B and FIG. 16C, a second temperature compensation sub-layer L2 is then formed over the piezoelectric substrate 100 to cover the first temperature compensation sub-layer L1 and the interdigital transducer, and fill into the recess 100r of the piezoelectric substrate 100.

In this embodiment, since the etching process for forming the recess in the piezoelectric substrate is performed after the first temperature compensation sub-layer L1 is formed, the first temperature compensation sub-layer L1 does not extend into the recess of the piezoelectric substrate, and the protruding part of the first temperature compensation layer can be purely constituted by the second temperature compensation sub-layer L2 filled in the recess, so that a contact area between the second temperature compensation sub-layer and the piezoelectric substrate can be increased, and therefore, the temperature compensation performance of the temperature compensation layer can be further improved on the basis of protecting the interdigital transducer against oxidation, thereby improving the temperature coefficient of frequency of the resonator device and the filter.

Figure 17A:
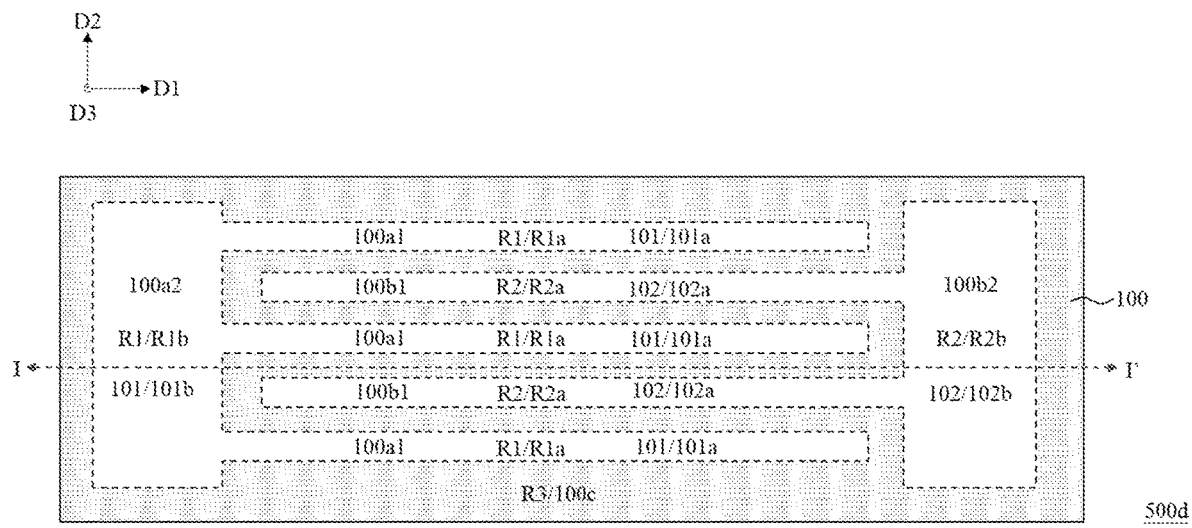
FIG. 17A illustrates a schematic top view of a surface acoustic wave resonator device according to still further some other embodiments of the present disclosure.
Figure 17B:
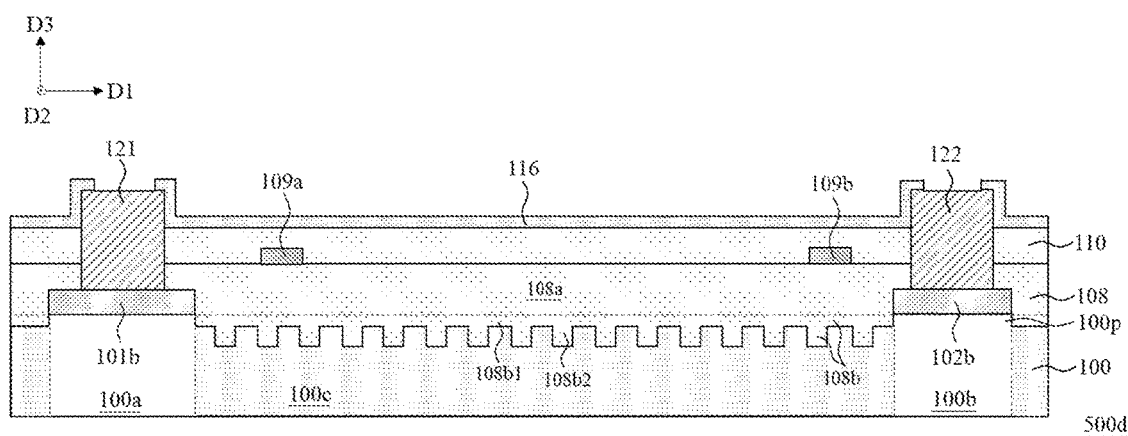
FIG. 17B illustrates a schematic cross-sectional view of a surface acoustic wave resonator device according to still further some other embodiments of the present disclosure, taken along a line I-I' of FIG. 17A.

FIG. 17A illustrates a schematic top view of a surface acoustic wave resonator device 500d according to further some other embodiments of the present disclosure; FIG. 17B illustrates a schematic cross-sectional view of a surface acoustic wave resonator device according to further some other embodiments of the present disclosure, taken along a line I-I' of FIG. 17A. It should be understood that, for simplicity and clarity of illustration, only the respective piezoelectric parts of the piezoelectric substrate and the interdigital transducer are illustrated in FIG. 17A, and other components are not illustrated. The surface acoustic wave resonator device 500d is similar to the surface acoustic wave resonator device of the previous embodiment, and the difference lies in that, in the surface acoustic wave resonator device 500d, the protruding part 108b of the first temperature compensation layer 108 further includes a plurality of sub-protrusions.

Referring to FIG. 17A and FIG. 17B, in some embodiments, in the surface acoustic wave resonator device 500d, the first temperature compensation layer 108 includes a body part 108a and a protruding part 108b. The protruding part 108b is protruded from the body part 108a towards the piezoelectric substrate in a direction perpendicular to the main surface of the piezoelectric substrate 100. The protruding part 108b is embedded in the piezoelectric substrate 100, and is surrounded by the piezoelectric substrate 100 in a direction parallel to the main surface of the piezoelectric substrate.

In some embodiments, the protruding part 108b includes a main protrusion 108b1 and a plurality of sub-protrusions 108b2. The main protrusion 108b1 is connected to and in direct contact with the body part 108a, and the plurality of sub-protrusions 108b2 may be located on a side of the main protrusion 108b1 away from the body part 108a in the third direction D3 and embedded in the third piezoelectric part 100c of the piezoelectric substrate. For example, the plurality of sub-protrusions 108b2 may be protruded from a surface (e.g., the bottom surface) of the main protrusion 108b1 at a side close to the piezoelectric substrate, towards the piezoelectric substrate 100 in the third direction D3. That is, a distance between the plurality of sub-protrusions 108b2 and a surface (e.g., the bottom surface) of the piezoelectric substrate 100 at a side away from the interdigital transducer is smaller than a distance between the main protrusion 108b2 and the surface of the piezoelectric substrate 100.

In some embodiments, sidewalls of the main protrusion 108b1 may be in contact with the piezoelectric protrusions 100p of the first piezoelectric part 100a and the second piezoelectric part 100b of the piezoelectric substrate 100, and the surface of the main protrusion 108b1 at the side close to the piezoelectric substrate in the third direction D3 is in contact with the third piezoelectric part 100c. The plurality of sub-protrusions 108b2 are embedded in the third piezoelectric part 100c, and surfaces of at least part of the sub-protrusions 108b2 close to the piezoelectric substrate are in contact with the third piezoelectric part 100c, and sidewalls of at least part of the sub-protrusions 108b2 may be in contact with the third piezoelectric part 100c and/or the first piezoelectric part 100a and the second piezoelectric part 100b.

In some embodiments, the plurality of sub-protrusions 108b2 may be disposed in a region between adjacent strip-shaped piezoelectric parts and/or in an edge region of the third piezoelectric part away from the first piezoelectric part and the second piezoelectric part. For instance, in some examples, part of the plurality of sub-protrusions 108b2 may be disposed in the third piezoelectric part 100c between adjacent first and second strip-shaped piezoelectric parts 100a1 and 100b1 in the second direction D2, and these sub-protrusions 108b2 may be arranged at intervals along the first direction D1 and between the first and second block-shaped piezoelectric parts 100a2 and 100b2. That is, part of the plurality of sub-protrusions 108b2 may be arranged at intervals along the first direction D1, and orthographic projections of the part of sub-protrusions 108b2 on the main surface of the piezoelectric substrate 100 may be located between orthographic projections of adjacent first and second interdigital electrodes on the main surface of the piezoelectric substrate in the second direction D2. It should be understood that the positions of the plurality of sub-protrusions illustrated in the figure are only for exemplary illustration, and the positions and numbers of the sub-protrusions are not limited in the present disclosure, as long as the process conditions can be satisfied.

In some embodiments, the manufacturing method of the surface acoustic wave resonator device 500d is similar to those of the previous embodiment, and the difference lies in that: in the previous embodiments, the etching process of the piezoelectric substrate uses the interdigital transducer as an etching mask, and the removed portions of the third piezoelectric part in different regions have the same height; while in this embodiment, the piezoelectric substrate is subjected to two times of etching processes so that the removed portions of the third piezoelectric part in different regions have different heights, and that the first temperature compensation layer formed subsequently has a main protrusion and a plurality of sub-protrusions. For example, performing an etching process on the piezoelectric substrate includes: performing a first etching process using the interdigital transducer as a first etching mask, so as to remove a portion of the piezoelectric substrate exposed by the interdigital transducer (i.e., the portion located in the third piezoelectric region); and performing a second etching process using the interdigital transducer and an additional mask collectively as a second etching mask, so as to further remove portions of the third piezoelectric part exposed by the second etching mask, wherein the additional mask includes a plurality of mask openings, and the plurality of mask openings expose the portions of the third piezoelectric region.

For example, in the step illustrated in FIG. 5A, the first etching process is performed on the piezoelectric substrate 100 using the interdigital transducer 105 as the first etching mask, thereby forming a recess 100r in the piezoelectric substrate 100, which may also be referred to as a main recess. Thereafter, before forming the temperature compensation layer, the method may further include performing a second etching process on the piezoelectric substrate 100 to further form a plurality of sub-recesses in the third piezoelectric part of the piezoelectric substrate 100. For example, after forming the recess 100r, an additional mask is formed on the piezoelectric substrate to cover at least a portion of the third piezoelectric part 100c and expose some other portions of the third piezoelectric part 100c; a second etching process is performed on the piezoelectric substrate using the additional mask and the interdigital transducer collectively as a second etching mask, so as to remove portions of the third piezoelectric part exposed by the second etching mask, thereby forming a plurality of sub-recesses in the third piezoelectric part. Thereafter, a first temperature compensation layer is formed on the piezoelectric substrate and the interdigital transducer and is filled into the main recess and the plurality of sub-recesses of the piezoelectric substrate, and portions of the first temperature compensation layer filled in the main recess and the plurality of sub-recesses are respectively the main protrusion and the plurality of sub-protrusions of the protruding part. Other structural features of the surface acoustic wave resonator device 500d and other steps of the manufacturing method therefor are substantially the same as those described in the previous embodiments, which are not described again here.

An embodiment of the present disclosure provides a filter including a surface acoustic wave resonator device described in any of the above embodiments.

In the surface acoustic wave resonator device and the filter of the embodiments of the present disclosure, the temperature compensation layer is configured to have a protruding part, and the protruding part is embedded in the piezoelectric substrate, so that the thickness of at least part of the temperature compensation layer is increased, and the contact area between the temperature compensation layer and the piezoelectric substrate is increased, thereby improving the temperature coefficient of frequency of the resonator device and the filter. Moreover, the piezoelectric parts of the piezoelectric substrate that are in contact with the interdigital electrode structures of the interdigital transducer are respectively continuous, that is, each piezoelectric part of the first piezoelectric part and the second piezoelectric part will not be disconnected by the protruding part of the temperature compensation layer, so that the reliability and stability of acoustic-electrical energy conversion of the interdigital transducer can be ensured while improving the temperature coefficient of frequency of the device.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

What is claimed is:

1. A surface acoustic wave resonator device, comprising:
a piezoelectric substrate;
an interdigital transducer, disposed on the piezoelectric substrate and comprising a first interdigital electrode structure and a second interdigital electrode structure, wherein the first interdigital electrode structure comprises a first interdigital electrode and a first interdigital electrode lead-out part connected with each other, the second interdigital electrode structure comprises a second interdigital electrode and a second interdigital electrode lead-out part connected with each other; the first interdigital electrode and the second interdigital electrode extend along a first direction and are arranged along a second direction; and a first temperature compensation layer, disposed on the piezoelectric substrate and comprising a body part and a protruding part, wherein the body part covers a sidewall of the interdigital transducer and a first surface of the interdigital transducer at a side away from the piezoelectric substrate, the protruding part is protruded from the body part towards the piezoelectric substrate in a third direction perpendicular to a main surface of the piezoelectric substrate, and is surrounded by the piezoelectric substrate in a direction parallel to the main surface of the piezoelectric substrate, wherein the piezoelectric substrate comprises a first piezoelectric part and a second piezoelectric part, and a first piezoelectric surface of the first piezoelectric part is in contact with a first electrode surface of the first interdigital electrode structure and extends continuously along the first electrode surface, and a second piezoelectric surface of the second piezoelectric part is in contact with a second electrode surface of the second interdigital electrode structure and extends continuously along the second electrode surface, and wherein an orthographic projection of the protruding part of the first temperature compensation layer on the main surface of the piezoelectric substrate is offset from an orthographic projection of the interdigital transducer on the main surface of the piezoelectric substrate.

2. The surface acoustic wave resonator device according to claim 1, wherein
a contact area between the first interdigital electrode structure and the first piezoelectric part is equal to an area of the first electrode surface; or
a contact area between the second interdigital electrode structure and the second piezoelectric part is equal to an area of the second electrode surface.

3. The surface acoustic wave resonator device according to claim 1, wherein the first piezoelectric surface and the second piezoelectric surface are spaced apart from each other by the protruding part of the first temperature compensation layer.

4. The surface acoustic wave resonator device according to claim 1, wherein the piezoelectric substrate further comprises a third piezoelectric part overlapped with the protruding part of the first temperature compensation layer in the third direction; and a height of the first piezoelectric part and a height of the second piezoelectric part are greater than a height of the third piezoelectric part.

5. The surface acoustic wave resonator device according to claim 4, wherein a surface of the protruding part at a side close to the piezoelectric substrate in the third direction is in contact with the third piezoelectric part, and sidewalls of the protruding part are in contact with the first piezoelectric part and the second piezoelectric part.

6. The surface acoustic wave resonator device according to claim 4, wherein a contact area between the first temperature compensation layer and the piezoelectric substrate is larger than an area of an orthographic projection of the third piezoelectric part on the main surface of the piezoelectric substrate.

7. The surface acoustic wave resonator device according to claim 1, wherein the protruding part of the first temperature compensation layer comprises a main protrusion and a plurality of sub-protrusions, the main protrusion is connected to the body part, and the plurality of sub-protrusions are located on a side of the main protrusion away from the body part in the third direction and are embedded in a third piezoelectric part of the piezoelectric substrate.

8. The surface acoustic wave resonator device according to claim 1, comprising at least one of following features:
wherein the first piezoelectric part comprises a first strip-shaped piezoelectric part and a first block-shaped piezoelectric part that are in contact with the first interdigital electrode and the first interdigital electrode lead-out part respectively, and the first strip-shaped piezoelectric part and the first block-shaped piezoelectric part are directly connected to each other;
wherein the second piezoelectric part comprises a second strip-shaped piezoelectric part and a second block-shaped piezoelectric part that are in contact with the second interdigital electrode and the second interdigital electrode lead-out part respectively, and the second strip-shaped piezoelectric part and the second block-shaped piezoelectric part are directly connected to each other.

9. The surface acoustic wave resonator device according to claim 1, wherein
the first temperature compensation layer comprises a first temperature compensation sub-layer and a second temperature compensation sub-layer,
the first temperature compensation sub-layer is at least located in the body part, and covers the sidewall of the interdigital transducer and the first surface of the interdigital transducer at the side away from the piezoelectric substrate, and the interdigital transducer is spaced apart from the second temperature compensation sub-layer by the first temperature compensation sub-layer.

10. The surface acoustic wave resonator device according to claim 9, wherein the first temperature compensation sub-layer further extends to cover a portion of a surface of the piezoelectric substrate, and the second temperature compensation sub-layer is spaced apart from the piezoelectric substrate by the first temperature compensation sub-layer.

11. The surface acoustic wave resonator device according to claim 9, wherein the first temperature compensation sub-layer has an opening, and the second temperature compensation sub-layer passes through the opening to be in contact with the piezoelectric substrate.

12. The surface acoustic wave resonator device according to claim 11, wherein
the protruding part of the first temperature compensation layer comprises a portion of the first temperature compensation sub-layer and a portion of the second temperature compensation sub-layer; the portion of the first temperature compensation sub-layer covers a sidewall of the first piezoelectric part and a sidewall of the second piezoelectric part; and the portion of the second temperature compensation sub-layer is in direct contact with a third piezoelectric part of the piezoelectric substrate; or
the protruding part of the first temperature compensation layer comprises a portion of the second temperature compensation sub-layer, and the portion of the second temperature compensation sub-layer is located on a third piezoelectric part of the piezoelectric substrate and is in contact with a sidewall of the first piezoelectric part and a sidewall of the second piezoelectric part.

13. The surface acoustic wave resonator device according to claim 1, further comprising:
a clutter suppression structure, disposed on a side of the first temperature compensation layer away from the piezoelectric substrate; and a second temperature compensation layer, disposed on the side of the first temperature compensation layer away from the piezoelectric substrate and covering the clutter suppression structure.

14. A filter, comprising the surface acoustic wave resonator device according to claim 1.

15. A method for manufacturing a surface acoustic wave resonator device, comprising:
providing a piezoelectric substrate;
forming an interdigital transducer on the piezoelectric substrate, wherein the interdigital transducer comprises a first interdigital electrode structure and a second interdigital electrode structure, the first interdigital electrode structure comprises a first interdigital electrode and a first interdigital electrode lead-out part connected with each other, the second interdigital electrode structure comprises a second interdigital electrode and a second interdigital electrode lead-out part connected with each other; the first interdigital electrode and the second interdigital electrode extend along a first direction and are arranged along a second direction; the piezoelectric substrate has a first piezoelectric region, a second piezoelectric region and a third piezoelectric region, the first piezoelectric region and the second piezoelectric region are respectively covered by the first interdigital electrode structure and the second interdigital electrode structure, and the third piezoelectric region is exposed by the interdigital transducer;
performing an etching process on the piezoelectric substrate using the interdigital transducer as an etching mask, so as to remove a portion of the piezoelectric substrate located in the third piezoelectric region, and after the etching process is performed, the piezoelectric substrate comprises a first piezoelectric part, a second piezoelectric part and a third piezoelectric part respectively located in the first piezoelectric region, the second piezoelectric region and the third piezoelectric region, and a height of the third piezoelectric part is smaller than a height of the first piezoelectric part and a height of the second piezoelectric part; and
forming a first temperature compensation layer on the piezoelectric substrate, wherein the first temperature compensation layer comprises a body part and a protruding part, the body part covers a sidewall of the interdigital transducer and a surface of the interdigital transducer at a side away from the piezoelectric substrate, the protruding part is protruded from the body part towards the piezoelectric substrate in a third direction perpendicular to a main surface of the piezoelectric substrate and is surrounded by the piezoelectric substrate in a direction parallel to the main surface of the piezoelectric substrate, wherein an orthographic projection of the protruding part of the first temperature compensation layer on the main surface of the piezoelectric substrate is offset from an orthographic projection of the interdigital transducer on the main surface of the piezoelectric substrate.

16. The method for manufacturing the surface acoustic wave resonator device according to claim 15, wherein
the etching process only uses the interdigital transducer as the etching mask, and removed portions of the third piezoelectric part in different regions have a same height; or
the etching process comprises: performing a first etching process using the interdigital transducer as a first etching mask to remove a portion of the piezoelectric substrate exposed by the interdigital transducer; and performing a second etching process using the interdigital transducer and an additional mask collectively as a second etching mask, so as to further remove portions of the third piezoelectric part exposed by the second etching mask, wherein the additional mask comprises a plurality of mask openings exposing the portions of the third piezoelectric region.

17. The method for manufacturing the surface acoustic wave resonator device according to claim 15, wherein forming the first temperature compensation layer comprises:
forming a first temperature compensation sub-layer to at least cover the sidewall of the interdigital transducer and the surface of the interdigital transducer at the side away from the piezoelectric substrate; and
forming a second temperature compensation sub-layer on the piezoelectric substrate and on the first temperature compensation sub-layer.

18. The method for manufacturing the surface acoustic wave resonator device according to claim 17, wherein forming the first temperature compensation sub-layer comprises:
forming the first temperature compensation sub-layer on the piezoelectric substrate and on the interdigital transducer; and
forming an opening in the first temperature compensation sub-layer to expose a portion of the piezoelectric substrate located in the third piezoelectric region.

19. The method for manufacturing the surface acoustic wave resonator device according to claim 18, wherein both the first temperature compensation sub-layer and the second temperature compensation sub-layer are formed after the etching process; or
the first temperature compensation sub-layer is formed before the etching process, and the second temperature compensation sub-layer is formed after the etching process.

* * * * *